(12) United States Patent
Nakamura et al.

(10) Patent No.: US 8,957,466 B2
(45) Date of Patent: Feb. 17, 2015

(54) SEMICONDUCTOR DEVICE

(75) Inventors: Yoshitaka Nakamura, Tokyo (JP); Yasushi Yamazaki, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 227 days.

(21) Appl. No.: 13/094,142

(22) Filed: Apr. 26, 2011

(65) Prior Publication Data
US 2011/0266603 A1    Nov. 3, 2011

(30) Foreign Application Priority Data
Apr. 28, 2010    (JP) .................................. 2010-103858

(51) Int. Cl.
H01L 27/108    (2006.01)
H01L 29/94    (2006.01)
H01L 49/02    (2006.01)

(52) U.S. Cl.
CPC .... H01L 27/10897 (2013.01); H01L 27/10817 (2013.01); H01L 27/10852 (2013.01); H01L 27/10894 (2013.01); H01L 28/91 (2013.01)
USPC ....................................................... 257/306

(58) Field of Classification Search
CPC .......................... H01L 27/0288; H01L 27/108
See application file for complete search history.

(56) References Cited

U.S. PATENT DOCUMENTS

| | | | |
|---|---|---|---|
| 7,026,208 B2 | 4/2006 | Park et al. | |
| 8,143,699 B2 * | 3/2012 | Ching et al. | 257/532 |
| 8,258,574 B2 * | 9/2012 | Han | 257/334 |
| 2001/0046737 A1 * | 11/2001 | Ahn et al. | 438/253 |
| 2002/0022317 A1 * | 2/2002 | Fukuzumi | 438/253 |
| 2003/0132429 A1 * | 7/2003 | Kim et al. | 257/1 |
| 2006/0113633 A1 * | 6/2006 | Park et al. | 257/534 |
| 2006/0289932 A1 * | 12/2006 | Ahn et al. | 257/334 |
| 2008/0122032 A1 * | 5/2008 | Tu et al. | 257/532 |
| 2009/0146254 A1 | 6/2009 | Hirota | |
| 2009/0256182 A1 * | 10/2009 | Sukekawa | 257/296 |
| 2010/0059806 A1 * | 3/2010 | Mizushima | 257/301 |
| 2010/0065944 A1 * | 3/2010 | Tu et al. | 257/532 |
| 2012/0056298 A1 * | 3/2012 | Kuroki | 257/532 |

FOREIGN PATENT DOCUMENTS

| | | | |
|---|---|---|---|
| JP | 2002-009174 A | 1/2002 |
| JP | 2002-083880 A | 3/2002 |
| JP | 2002-134506 A | 5/2002 |
| JP | 2003-297952 A | 10/2003 |
| JP | 2006-253393 A | 9/2006 |
| JP | 2008-021698 A | 1/2008 |
| JP | 2008-283026 A | 11/2008 |
| JP | 2009-253208 A | 10/2009 |
| JP | 2010-67661 A | 3/2010 |

* cited by examiner

*Primary Examiner* — Benjamin Sandvik
(74) *Attorney, Agent, or Firm* — Foley & Lardner LLP

(57) ABSTRACT

A semiconductor device may include, but is not limited to: a semiconductor substrate; a memory capacitor; and a first compensation capacitor. The semiconductor substrate has at least first and second regions. The memory capacitor is positioned over the first region. The memory capacitor may include, but is not limited to: a first lower electrode; and a first dielectric film covering inner and outer surfaces of the first lower electrode. The first compensation capacitor is positioned over the second region. The first compensation capacitor includes, but is not limited to: a second lower electrode; a second dielectric film covering an inner surface of the second lower electrode; and a first insulating film covering an outer surface of the second lower electrode.

19 Claims, 22 Drawing Sheets

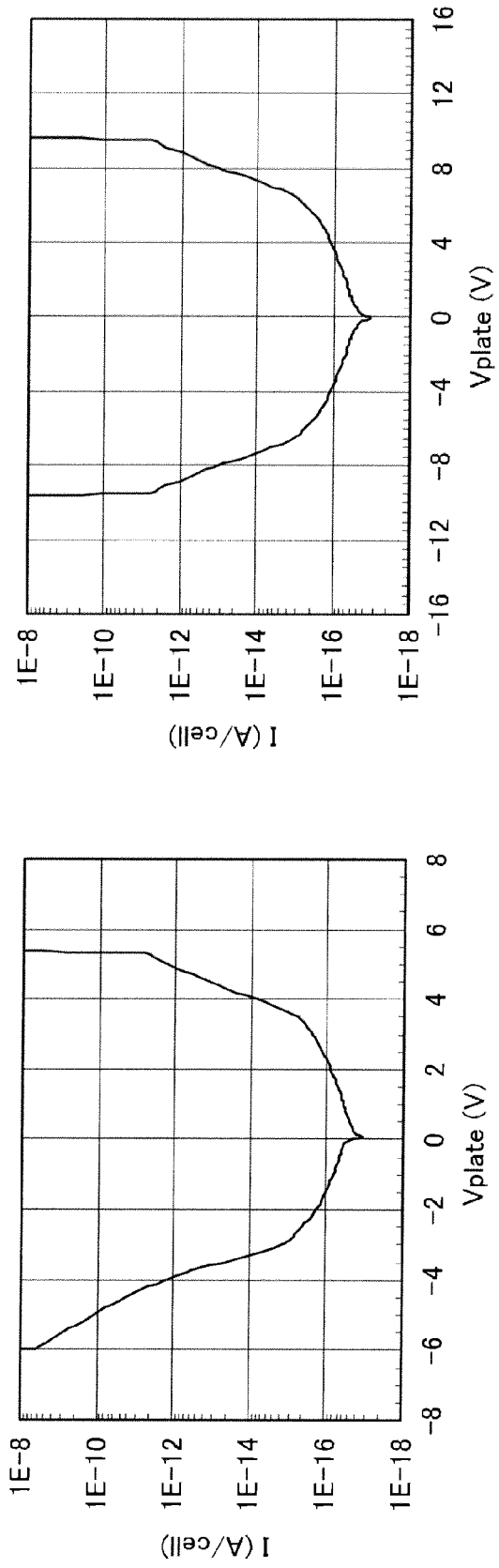

SEMICONDUCTOR DEVICE

BACKGROUND OF THE INVENTION

1. Field of the Invention

The present invention relates to a semiconductor device.

Priority is claimed on Japanese Patent Application No. 2010-103858, filed Apr. 28, 2010, the content of which is incorporated herein by reference.

2. Description of the Related Art

Generally, regarding semiconductor devices, such as a DRAM, operating power-supply voltages of circuit elements have been lowered to decrease power consumption. Specifically, a power-supply voltage, which is supplied from an external unit, is lowered to a desired value in a semiconductor device, and then is supplied to circuit elements.

Recently, with the decrease in operating power-supply voltages, it has been more and more important to stabilize and supply a power-supply voltage since a variation in power-supply voltage greatly affects circuit operation. For this reason, a technique of providing a compensation capacitor between a wire for supplying a power-supply voltage and a wire for supplying a ground voltage has been used (see, for example, Japanese Patent Laid-Open Publication No. 2006-253393 and No. 2010-067661).

Regarding capacitors to be used in DRAM memory cells, on the other hand, a crown capacitor has been used in order to increase capacitance without increasing the occupied area. In the crown capacitor, inner and outer surfaces of a lower electrode are used as electrodes. Additionally, a technique of providing a supporter has been used in order to prevent collapse of lower electrodes during manufacturing processes (see, for example, Japanese Patent Laid-Open Publication No. 2008-283026 and No. 2003-297952).

The crown capacitor has an electrode structure in which inner and outer surfaces of a cup-shaped electrode are used as capacitor electrodes. A concave capacitor, as will be explained later, has an electrode structure in which only an inner surface of the cup-shaped electrode is used as a capacitor electrode.

Regarding semiconductor devices, such as a DRAM, it has been known that a capacitor, which has the same structure as of a memory cell capacitor, is used as a compensation capacitor (see Japanese Patent Laid-Open Publication No. 2010-067661). The use of a capacitor having the same structure as of a memory cell capacitor enables a reduction in the area of the compensation capacitor compared to a planar capacitor.

With the further miniaturization of recent semiconductor devices, crown capacitors with large capacitance have been used in memory cells. Accordingly, crown capacitors have been also used as compensation capacitors.

If crown capacitors are used as compensation capacitors, however, the following problems arise. Regarding miniaturized crown capacitors, collapse of lower electrodes can be prevented by a support film structure as shown in, for example, Japanese Patent Laid-Open Publication No. 2008-283026 and No. 2003-297952. However, unexpected local deformation of electrodes cannot be prevented completely.

For this reason, stress causes cracks to randomly occur in a capacitor insulating film, an upper electrode, a connection portion of a lower electrode with a support film, the support film itself, and the like in some cases. If cracks occur in an electrode and a capacitor insulating film, the amount of leak current increases, thereby causing malfunction of the predetermined circuit operation.

Regarding memory cell capacitors, a defective memory cell is detected in an operation test after manufacturing processes. Then, the defective memory cell is replaced with a new one, thereby enabling normal circuit operation. A fuse element can be used to replace the defective memory cell.

Regarding compensation capacitors, it is difficult to replace a defective portion with such a fuse element. For this reason, when a crown capacitor used in the memory cell is used as the compensation capacitor, the amount of leak current due to the capacitor structure is likely to increase, thereby causing malfunction of the predetermined circuit operation.

Accordingly, when a crown capacitor is used as a memory cell capacitor, a crown capacitor cannot be used as a compensation capacitor. Therefore, a planar capacitor, which uses a gate electrode and the like of a MOS transistor, has to be used, thereby preventing a reduction in the occupied area of the compensation capacitor.

SUMMARY

In one embodiment, a semiconductor device may include, but is not limited to: a semiconductor substrate; a memory capacitor; and a first compensation capacitor. The semiconductor substrate has at least first and second regions. The memory capacitor is positioned over the first region. The memory capacitor may include, but is not limited to: a first lower electrode; and a first dielectric film covering inner and outer surfaces of the first lower electrode. The first compensation capacitor is positioned over the second region. The first compensation capacitor includes, but is not limited to: a second lower electrode; a second dielectric film covering an inner surface of the second lower electrode; and a first insulating film covering an outer surface of the second lower electrode.

In another embodiment, a semiconductor device includes, but is not limited to: a first insulating film; a first lower electrode over the first insulating film; a second lower electrode over the first insulating film, the second lower electrode being positioned adjacent to the first lower electrode; a first dielectric film covering an inner surface of the first lower electrode; a second dielectric film covering an inner surface of the second lower electrode; a first upper electrode covering the first dielectric film; a second upper electrode covering the second dielectric film; and a second insulating film covering outer surfaces of the first and second lower electrodes. One of the first and third electrodes is electrically connected to one of the second and fourth electrodes.

In another embodiment, a semiconductor device may include, but is not limited to: a memory capacitor; and a compensation capacitor separated from the memory capacitor. The memory capacitor may include, but is not limited to, a first lower electrode. Inner and outer surfaces of the first lower electrode functions as a capacitor electrode of the memory capacitor. The compensation capacitor may include, but is not limited to, a second lower electrode and a first insulating film. An inner surface of the second lower electrode functions as a capacitor electrode of the compensation capacitor. The first insulating film covers an outer surface of the second lower electrode.

BRIEF DESCRIPTION OF THE DRAWINGS

The above features and advantages of the present invention will be more apparent from the following description of certain preferred embodiments taken in conjunction with the accompanying drawings, in which:

FIG. 21A is a graph illustrating the I-V characteristics of a compensation capacitor of the semiconductor device of the first embodiment;

FIG. 21B is a graph illustrating the I-V characteristics of compensation capacitors of the semiconductor devices of the second and third embodiments;

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

First Embodiment

Figure 1:
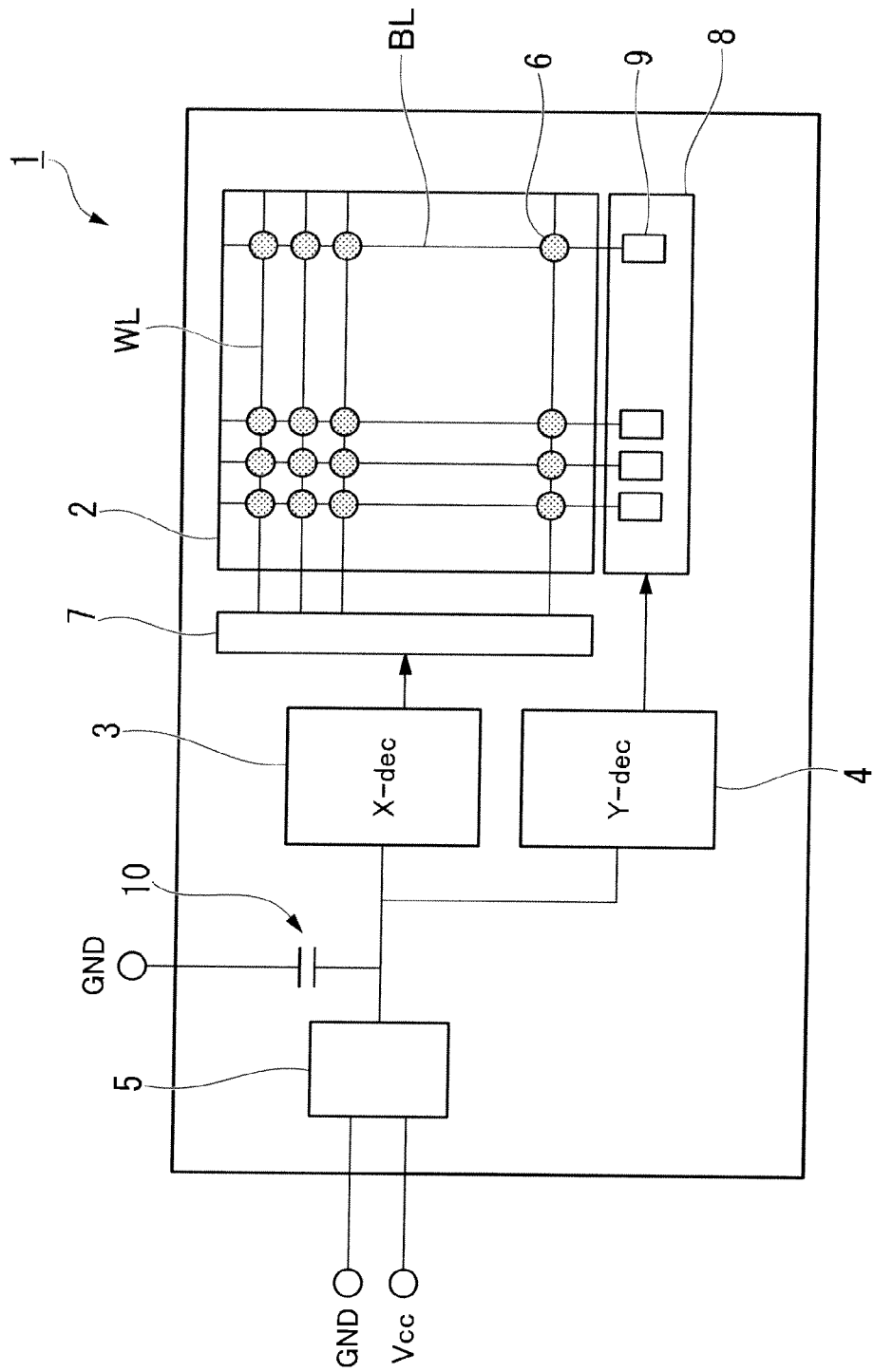
FIG. 1 is a circuit diagram illustrating a DRAM to which the present invention is applied.

Hereinafter, a DRAM (Dynamic Random Access Memory), which is a semiconductor device of a first embodiment of the present invention, is explained. FIG. 1 is a circuit diagram illustrating main part of the DRAM including a decoder circuit.

As shown in FIG. 1, a semiconductor chip 1 of the DRAM includes: a memory cell array 2; an X-decoder 3; a Y-decoder 4; and an internal power-supply circuit 5 that supplies an internal power to the decoders 3 and 4.

The memory cell array 2 includes multiple word wires WL and multiple bit wires BL. A memory cell 6 is formed at an intersection of each word wire WL with each bit wire BL. The memory cell 6 includes a capacitor 21a for storing data (see FIG. 3), and an MOS transistor for performing selection.

An external power-supply voltage Vcc and a ground voltage GND, which are supplied from outside the semiconductor chip 1, are supplied to an internal power-supply circuit 5. Then, the external power-supply voltage Vcc and the ground voltage GND are lowered to a predetermined voltage, and then are supplied to the X-decoder 3 and the Y-decoder 4.

An X-control circuit 7 operates according to an address signal input to the X-decoder 3, and selects a word wire WL.

A Y-control circuit 8 operates according to an address signal input to the Y-decoder 4, and selects a bit wire BL. In a read operation, data stored in a capacitor of the memory cell 6 selected is amplified by a sense amplifier circuit 9 via the bit line BL, and then is output to an external unit.

A compensation capacitor 10 is provided between the ground GND and a wire that connects the internal power circuit 5 to the X-decoder 3 and the Y-decoder 4. The compensation capacitor 10 prevents a variation in the internal power-supply voltage supplied to the X decoder 3 and the Y-decoder 4.

Figure 2:
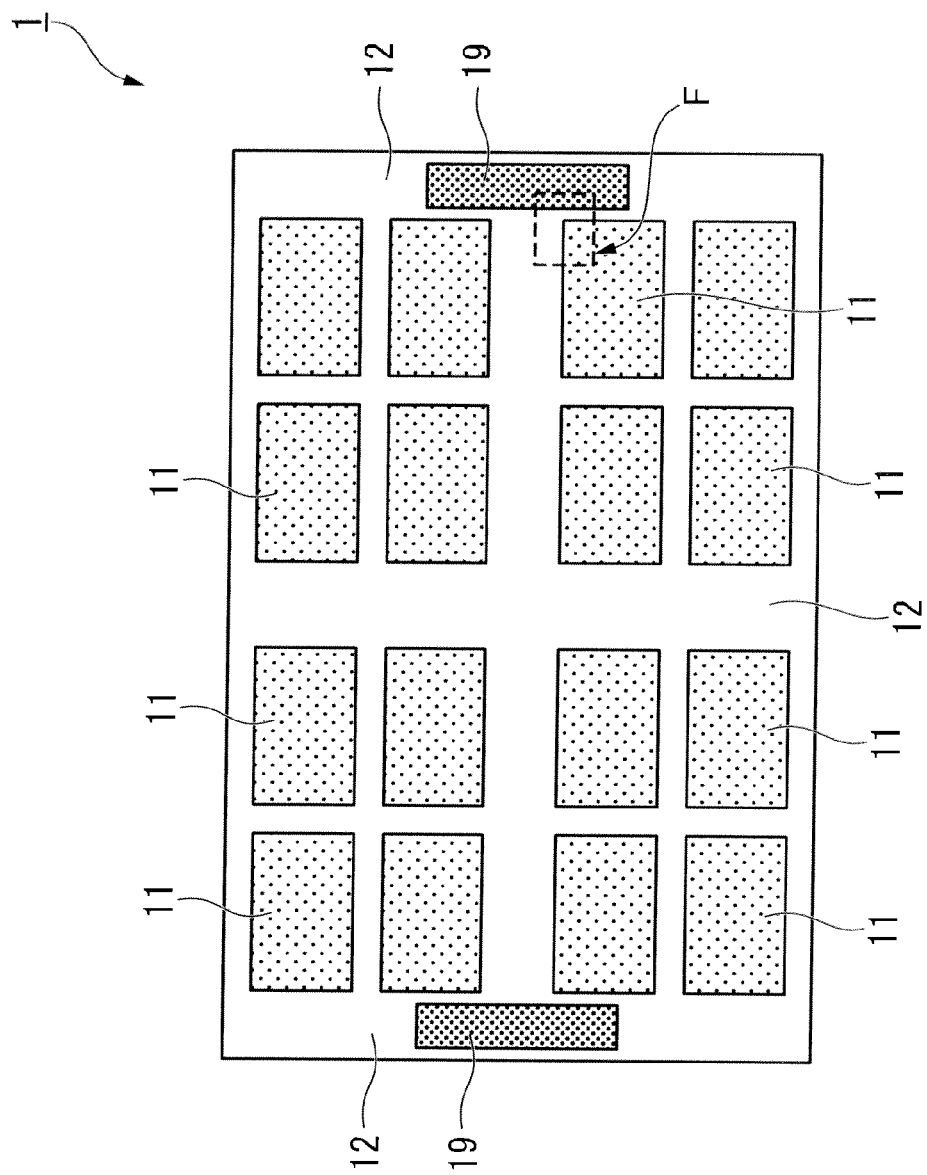
FIG. 2 is a plan view illustrating the layout of the DRAM.

FIG. 2 is a plan view illustrating the layout of the semiconductor chip 1. As shown in FIG. 2, the semiconductor chip 1 includes multiple memory cell regions 11 and a peripheral circuit region 12 surrounding the memory cell regions 11. Each of the memory cell regions 11 includes the memory cell array 2.

A circuit block, which is other than the memory cell array 2 including the sense amplifier circuit 9, the decoder circuits 3 and 4, and the like, is formed in the peripheral circuit region 12. The peripheral circuit region 12 has a compensation capacity region 19. The compensation capacitor 10 is included in the compensation capacitor region 19. The layout shown in FIG. 2 is just an example, and the number and positions of memory cell regions 11 are not limited thereto.

Figure 3:
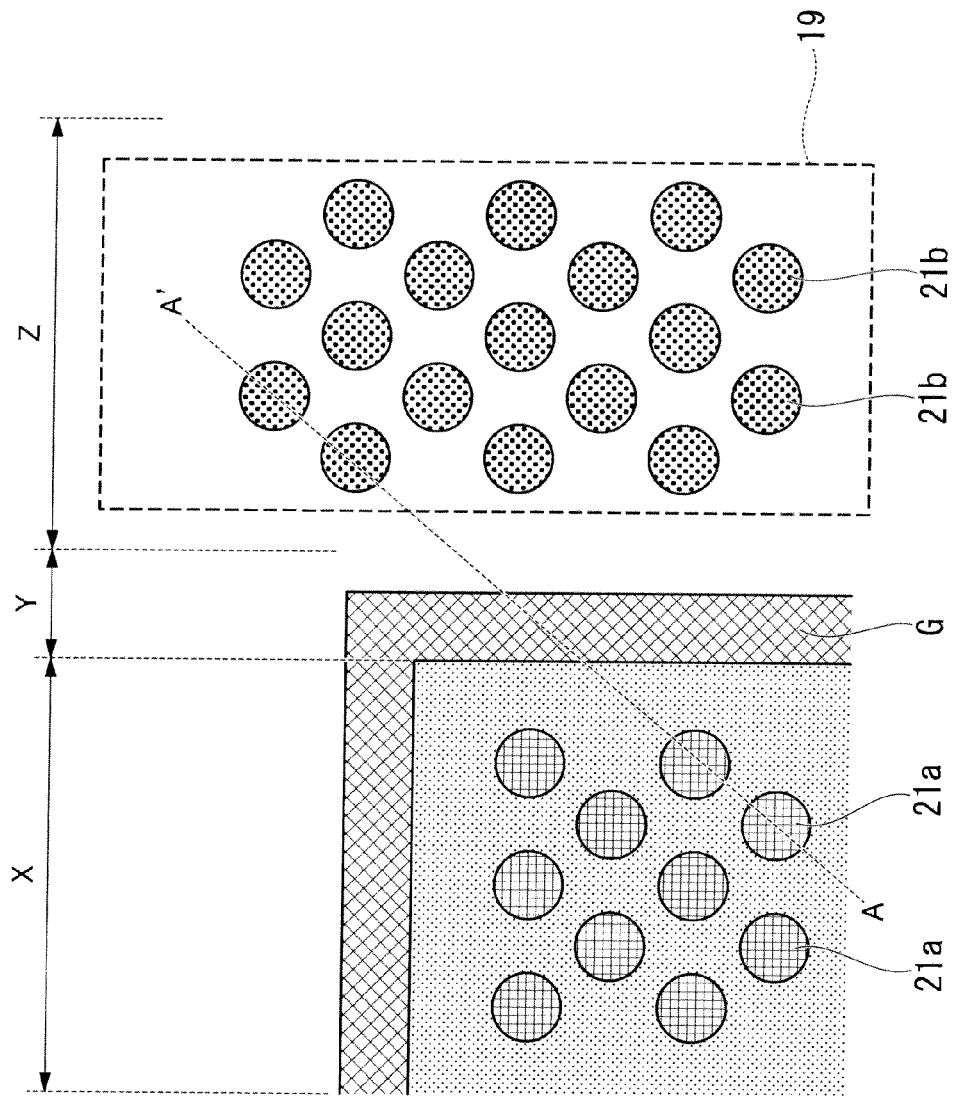
FIG. 3 is an enlarged plan view illustrating part of FIG. 2.

FIG. 3 is an enlarged plan view illustrating a portion of the peripheral circuit region 12 indicated by a dashed line F shown in FIG. 2, which partially includes both the memory cell region 11 and the compensation capacitor region 19. A reference numeral X denotes the memory cell region 11. A reference numeral Y denotes a boundary region between the memory cell region 11 and the compensation capacitor region 19. The boundary region Y surrounds the memory cell region X and has a predetermined width. A reference numeral Z denotes the compensation capacitor region 19.

Multiple crown capacitors 21a, which form the memory cell 2 of the DRAM, are arranged in the memory cell region X. Multiple concave capacitors 21b, which form the compensation capacitors 10, are arranged in the compensation capacitor region 19 that is part of the peripheral circuit region Z.

A guard ring G surrounding the memory cell region X is provided. In a wet etching process included in a method of manufacturing the semiconductor device which will be explained later, the guard ring G functions as an etching stopper that prevents an etchant from penetrating the peripheral circuit region Z.

Hereinafter, a semiconductor device 20 according to the first embodiment is explained with reference to FIG. 16. The semiconductor device 20 includes: a semiconductor substrate 22; gate insulating films 25a and 25b on the semiconductor substrate 22; gate electrodes 28a and 28b on the gate insulating films 25a and 25b; an inter-layer insulating film 40 that covers the gate electrodes 28a and 28b; the capacitor 21a for memory cell 6, which is formed over the inter-layer insulating film 40; and the compensation capacitor 10 including the capacitor 21b.

The capacitor 21a includes: a cylindrical lower electrode 66a having a bottom surface; a dielectric film 67a that is a capacitor insulating film covering inner and outer surfaces of the lower electrode 66a; and an upper electrode 69a over the dielectric film 67a. In other words, the capacitor 21a is a crown capacitor, and the inner and outer surfaces of the lower electrode 66a are used as capacitor electrodes.

The compensation capacitor 10 includes: a cylindrical lower electrode 66b having a bottom surface; a dielectric film 67b that is a capacitor insulating film covering an inner surface of the lower electrode 66b; and an upper electrode 69b over the dielectric film 67b. In other words, the compensation capacitor 10 is a concave capacitor, and only the inner surface of the lower electrode 66b is used as a capacitor electrode.

Figure 12:
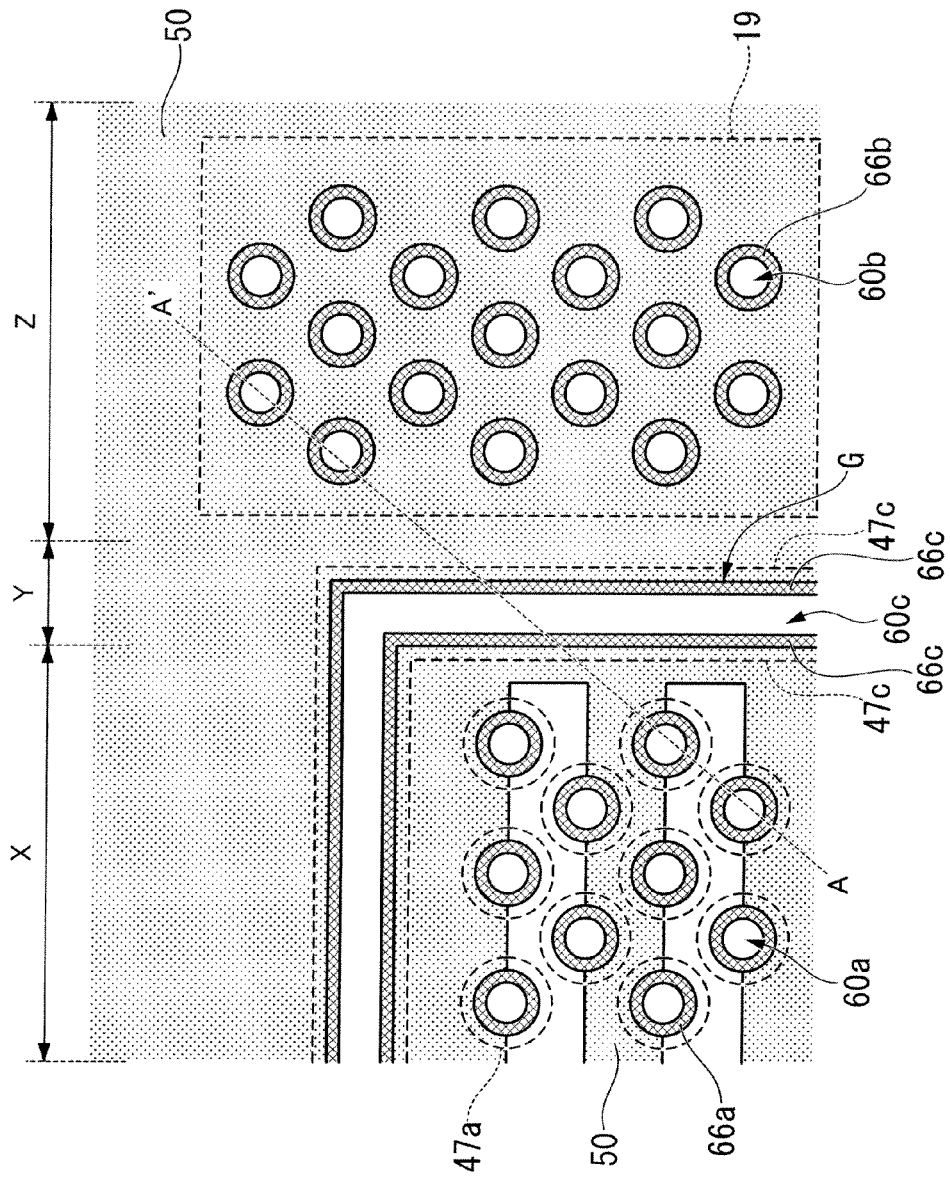
Figure 13:
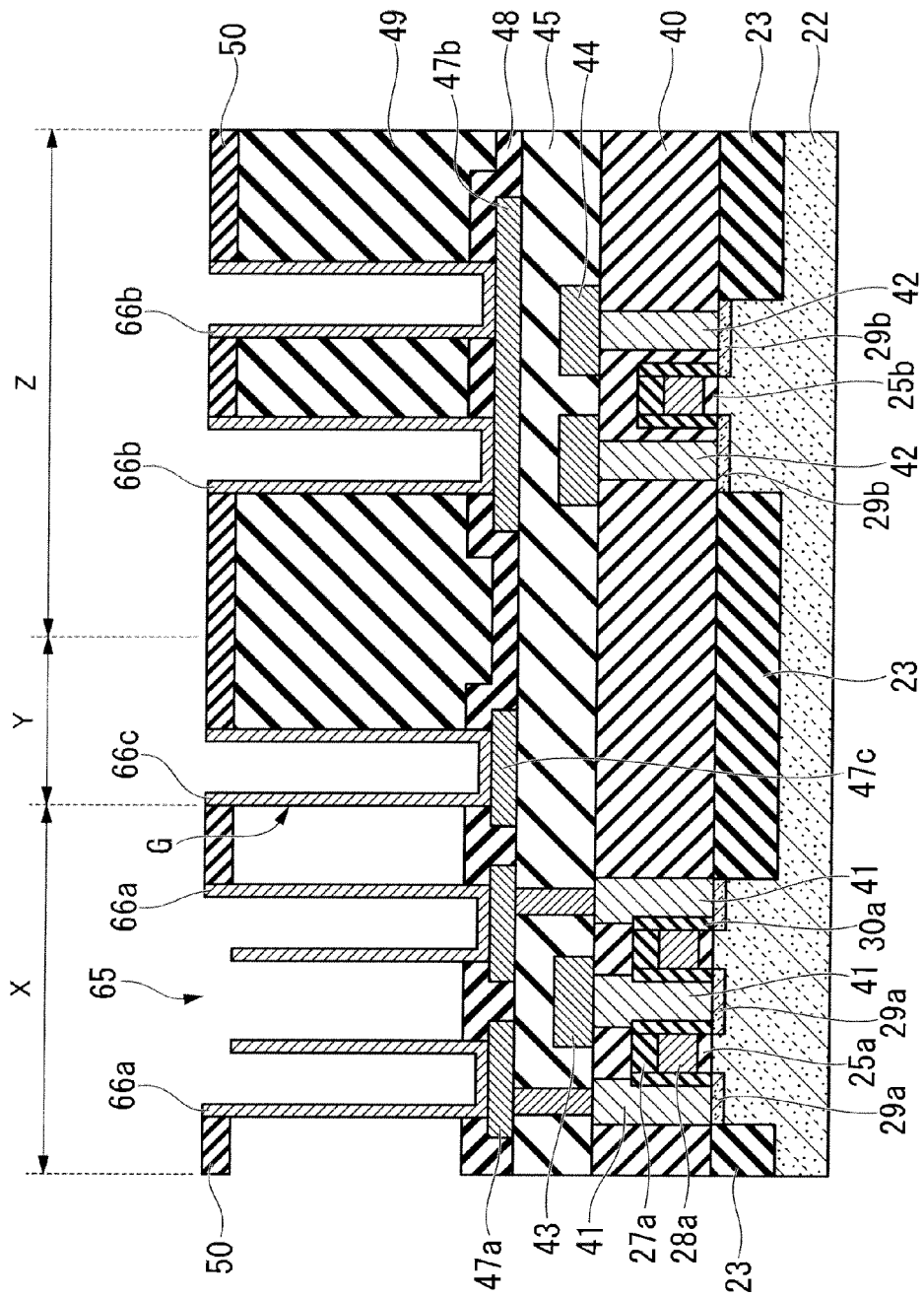

The semiconductor device 20 includes a guard ring G in the boundary region Y. The guard ring G mainly includes the lower electrode 66c. The guard ring G is used for preventing an etchant from penetrating from the memory cell region X into the peripheral circuit region Z. Accordingly, the lower electrode 66c has a bottom surface, but is not cylindrical. For example, the lower electrode 66c is formed so as to surround the memory cell region X, as shown in FIG. 12.

Figure 17:
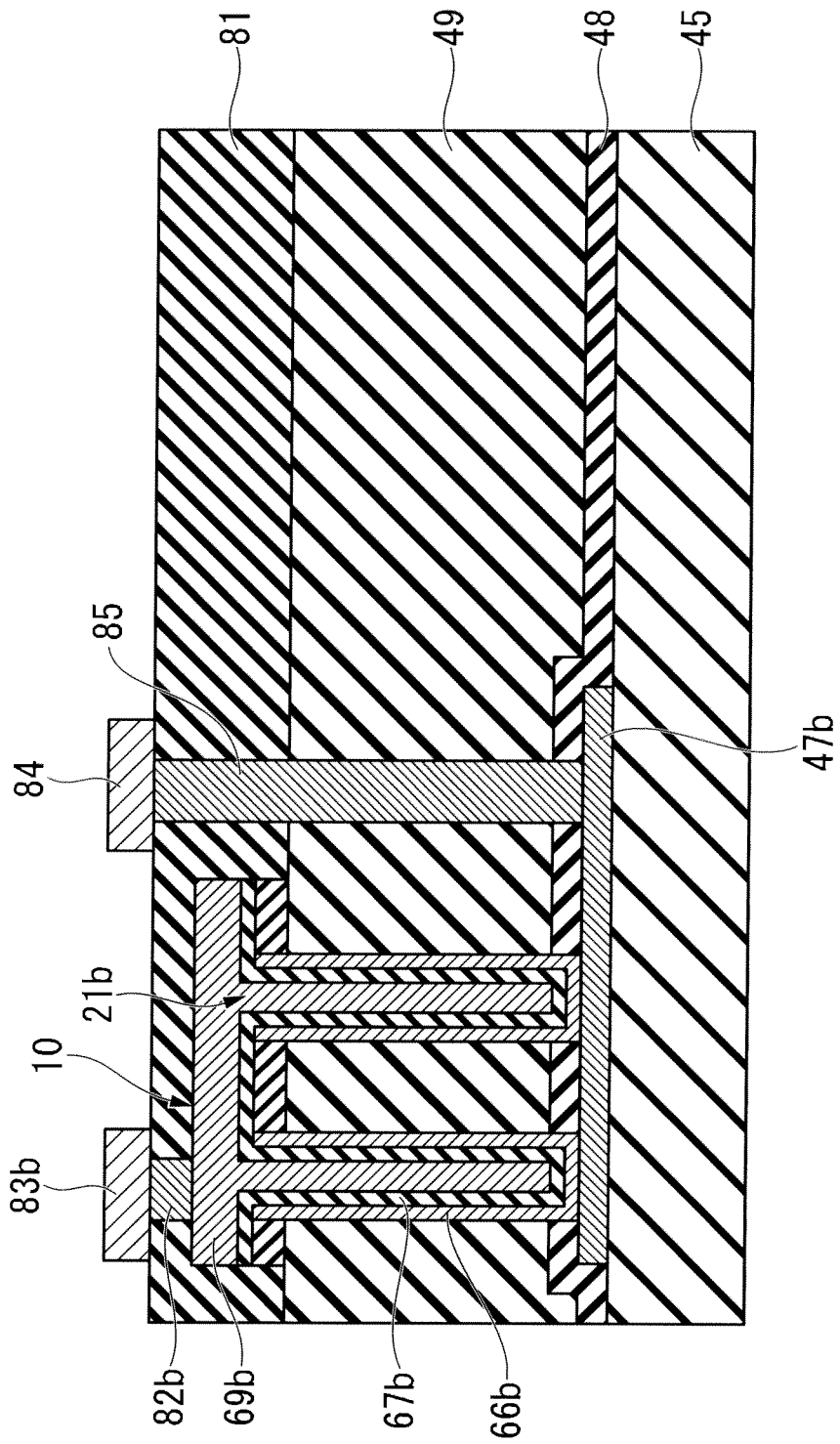

Hereinafter, the structure of the compensation capacitor 10 is explained in detail. As shown in FIG. 17, the compensation capacitor 10 of the first embodiment is a capacitor including multiple concave capacitors 21h, each of which includes lower electrodes 66b.

In other words, the compensation capacitor 10 includes: multiple lower electrodes 66b; the dielectric film 67b covering inner surfaces of the lower electrodes 66b; and one upper electrode 69b covering the dielectric film 67. The lower electrodes 66b are connected to a pad 47b. FIG. 17 shows only upper portions than the inter-layer insulating film 45 as a cross-sectional view, and the same applies to FIGS. 18 to 20.

The number of lower electrodes 66b connected to the pad 47b (two in the case of FIG. 17) may be determined according to capacitance required for the compensation capacitor 10. For example, the number of the lower electrodes 66b may be in the rage of 3000 to 10000.

The upper electrode 69b of the compensation capacitor 10 is connected to a drawing wire 83b through a contact plug 82b. A drawing wire 84 is connected to the pad 47b through a contact plug 85. The contract plug 82b and the contact plug 85 may be formed simultaneously.

A ground voltage is applied to one of the drawing wires 83b and 84, and the other one of the drawing wires 83b and 84 is connected to a wire for power-supply. Thus, the compensation capacitor 10 functions as a compensation capacitor having a predetermined capacitance.

Figure 4:
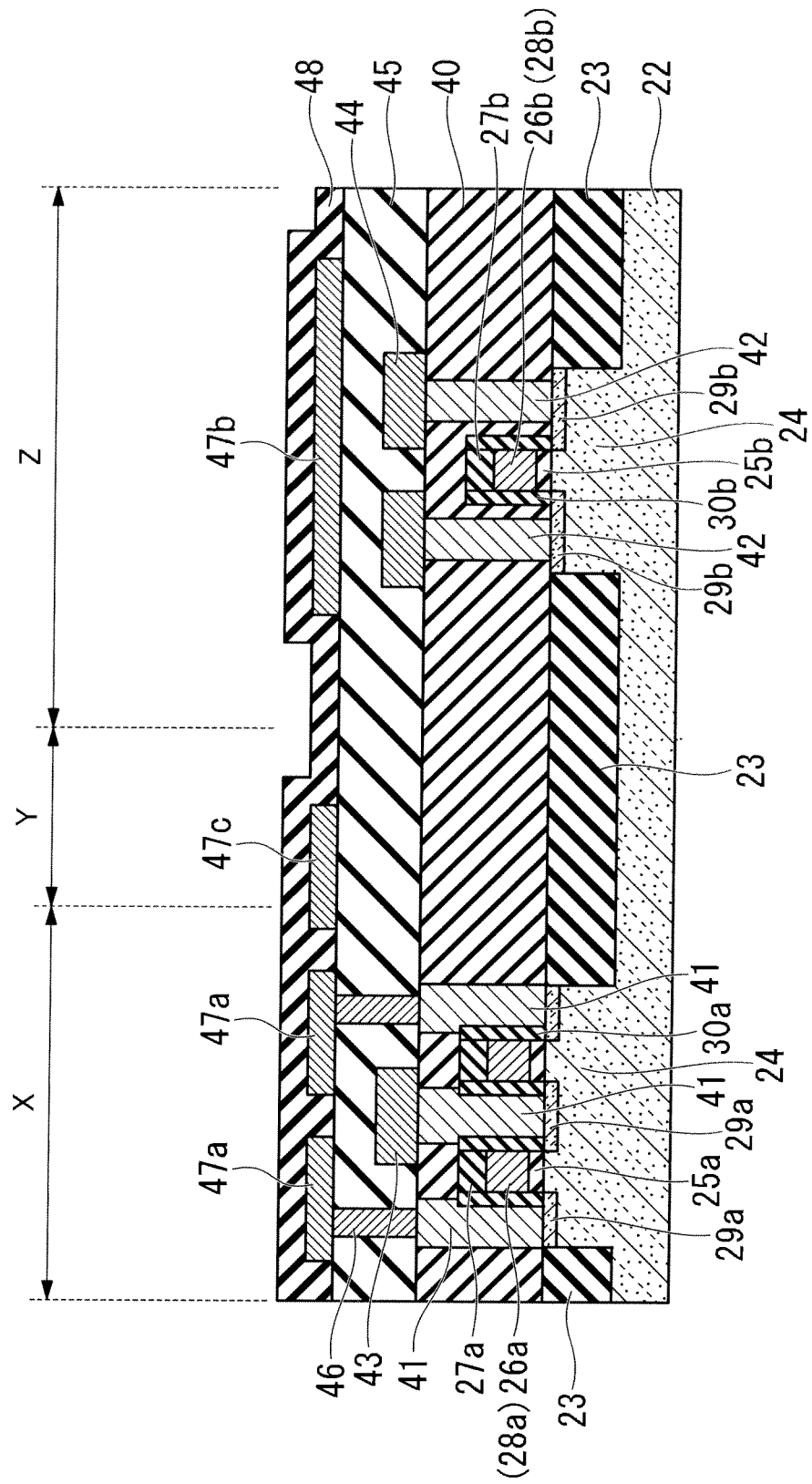
FIGS. 4 to 15 illustrate a process flow indicative of a method of manufacturing a semiconductor device according to a first embodiment of the present invention.
Figure 6:
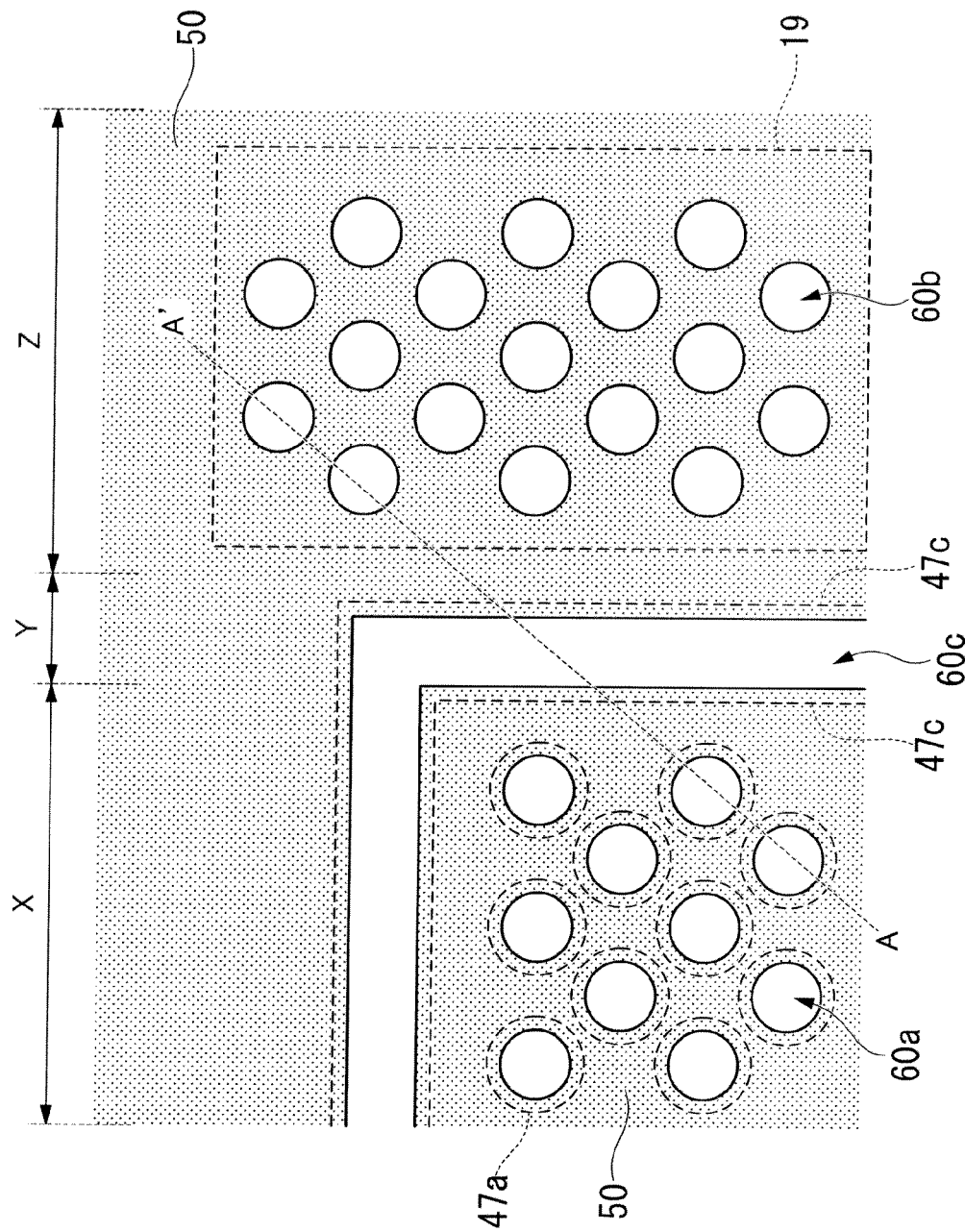
Figure 9:
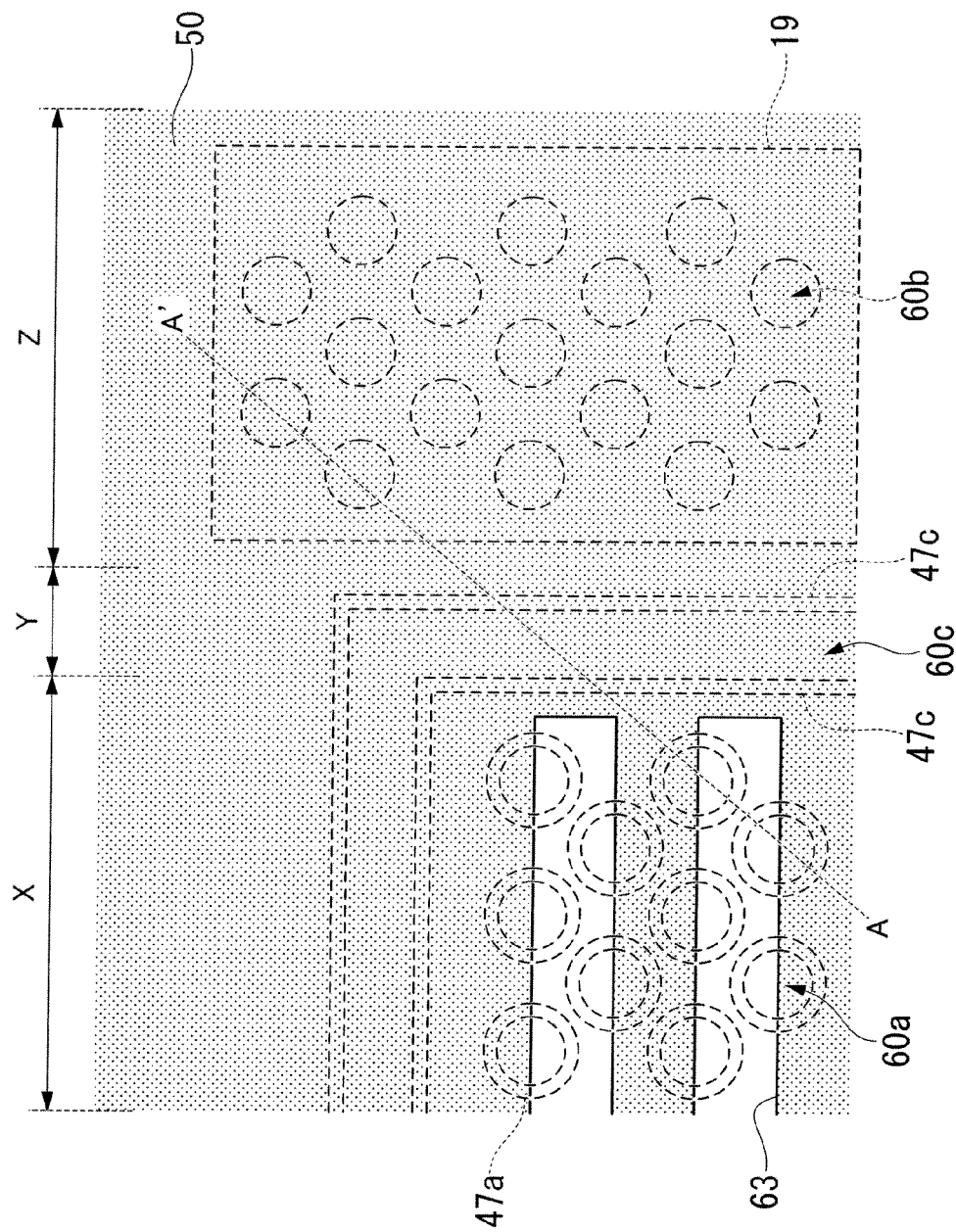

Hereinafter, a method of manufacturing the semiconductor device 20 is explained in detail. FIGS. 4. 5, 7, 8, 10, 11, and 13 to 16 are cross-sectional views taken along line A-A' shown in FIG. 3. FIGS. 6, 9, and 12 are plan views. The memory cell region X, the boundary region Y, and the peripheral circuit region Z are formed simultaneously unless particularly mentioned.

Firstly, a device isolation 23 is formed by an STI (Shallow Trench Isolation) method in the semiconductor substrate 22. The semiconductor substrate 22 is made of, for example, p-type silicon (Si). The regions defined by the device isolation 23 become active regions 24. An MOS transistor is formed in the active region 24.

Although a case in which a planar MOS transistor is formed is explained in the first embodiment, the present invention is not limited thereto. For example, a MOS transistor including a trench gate electrode, a vertical MOS transistor, and the like may be formed.

Then, the gate insulating film 25a is formed on the semiconductor substrate 22 in the memory cell region X. Then, a gate conductive film 26a is formed on the gate insulating film 25a. Then, a protection insulating film 27a is formed on the gate conductive film 26a. Then, the gate conductive film 26a and the protection insulating film 27a are patterned to form the gate electrode 28a.

Additionally, an n-type impurity, such as phosphorus or arsenic, is introduced into a surface region of the semiconductor substrate 22 to form, by self alignment, an impurity diffusion layer 29a adjacent to the gate electrode 28a. Then, a sidewall film 30a, which is made of an insulating film, is formed so as to cover a side surface of the gate electrode 28a. The gate electrode 28a functions as the word wire WL. The impurity diffusion layer 29a functions as an S/D (source-and/or-drain) region of an MOS transistor.

Similarly, the gate insulating film 25b is formed on the semiconductor substrate 22 in the peripheral circuit region Z. Then, a gate conductive film 26b is formed on the gate insulating film 25b. Then, a protection insulating film 27b is formed on the gate conductive film 26h. Then, the gate conductive film 26h and the protection insulating film 27b are patterned to form the gate electrode 28b.

Additionally, an n-type impurity, such as phosphorus or arsenic, is introduced into a surface region of the semiconductor substrate 22 to form, by self alignment, an impurity diffusion layer 29b adjacent to the gate electrode 28b. Then, a sidewall film 30b, which is made of an insulating film, is formed so as to cover a side surface of the gate electrode 28b. The impurity diffusion layer 29b functions as an S/D region of an MOS transistor.

Although it is explained in the first embodiment that an n-type MOS transistor is formed in the peripheral circuit region Z, the present invention is not limited thereto. For example, an n-type well may be formed in the semiconductor substrate 22 to form a p-type MOS transistor.

As a material forming the gate insulating films 25a and 25b, for example, a silicon oxide film may be used. As a material forming the gate conductive films 26a and 26b, a poly-crystalline silicon film containing phosphorus, a tungsten (W) film, a tungsten silicide (WSi) film, and a multi-layered film including these films may be used. As a material forming the protection insulating films 27a and 27b and the sidewall insulating films 30a and 30b, for example, a silicon nitride ($Si_3N_4$) film may be used.

Then, the inter-layer insulating film 40 is formed so as to cover the gate electrodes 28a and 28b. The inter-layer insulting film 40 is made of a silicon oxide film or the like. Then, an upper surface of the inter-layer insulating film 40 is polished and planarized by a CMP (Chemical Mechanical Polishing) method.

Then, a cell contact plug 41 is formed so as to be connected to the impurity diffusion layer 29a in the memory cell region X. The cell contact plug 41 is made of, for example, a poly-crystalline silicon film containing phosphorus. For example, an SAC (Self Alignment Contact) method may be used to form the cell contact plug 41.

Additionally, a peripheral contact plug 42 is formed so as to be connected to the impurity diffusion layer 29b in the peripheral circuit region Z. The peripheral contact plug 42 is made of tungsten or the like.

Then, a bit wire 43 is formed in the memory cell region X so as to be connected to one of the source and drain regions of the MOS transistor through the cell contact plug 41. As a material forming the bit wire 43, for example, a multi-layered film including a tungsten nitride (WN) film and a tungsten (W) film may be used.

Simultaneously with the formation of the bit wire 43, peripheral wires 44 are formed in the peripheral circuit region Z so as to be connected to the source and drain regions 29b of the MOS transistor through the peripheral contact plugs 42. Although not shown, a contact plug to be connected to the gate electrode 28b, and a wiring layer may be simultaneously formed in the peripheral circuit region Z.

Then, an inter-layer insulating film 45 is formed so as to cover the bit wire 43 and the peripheral wires 44. The inter-layer insulating film 45 is made of a silicon oxide film or the like. Then, an upper surface of the inter-layer insulating film 45 is polished and planarized by the CMP method.

Then, a capacitor contact plug 46 is formed in the memory cell region X so as to penetrate through the inter-layer insulating film 45 and to be connected to the cell contact plug 41. The capacitor contact plug 46 is made of a tungsten film or the like.

Then, a multi-layered film, which includes, for example, a tungsten nitride (WN) film and a tungsten (W) film over the tungsten nitride film, is patterned to form the pad 47a in the memory cell region X, the pad 47c in the boundary region Y, and the pad 47b in the peripheral circuit region Z. The pad 47a in the memory cell region X is formed so as to he connected to the capacitor contact plug 46.

The pad 47c in the boundary region Y is formed at a position at which the guard ring G is formed (i.e., the position adjacent to the periphery of the memory cell region X). The pad 47b in the peripheral circuit region Z is formed at a position at which the compensation capacitor 10 is formed (compensation capacitor region).

Different from the pad 47a in the memory cell region X, the pad 47b in the peripheral circuit region Z is formed as a large pad so as to connect multiple lower electrodes 66 of the capacitor 21b forming the compensation capacitor 10.

Then, a silicon nitride film is deposited by an LP-CVD (Low Pressure-CVD) method or an ALD (Atomic Layer Deposition) method to form a stopper film 48 covering the pads 47a, 47b, and 47c. The thickness of the silicon nitride film is, for example, 40 mm to 100 mm. In a wet etching process for forming the crown lower electrodes 66b that will be explained later, the stopper film 48 functions as an etching stopper for preventing an etchant from penetrating an underlying layer.

Figure 5:
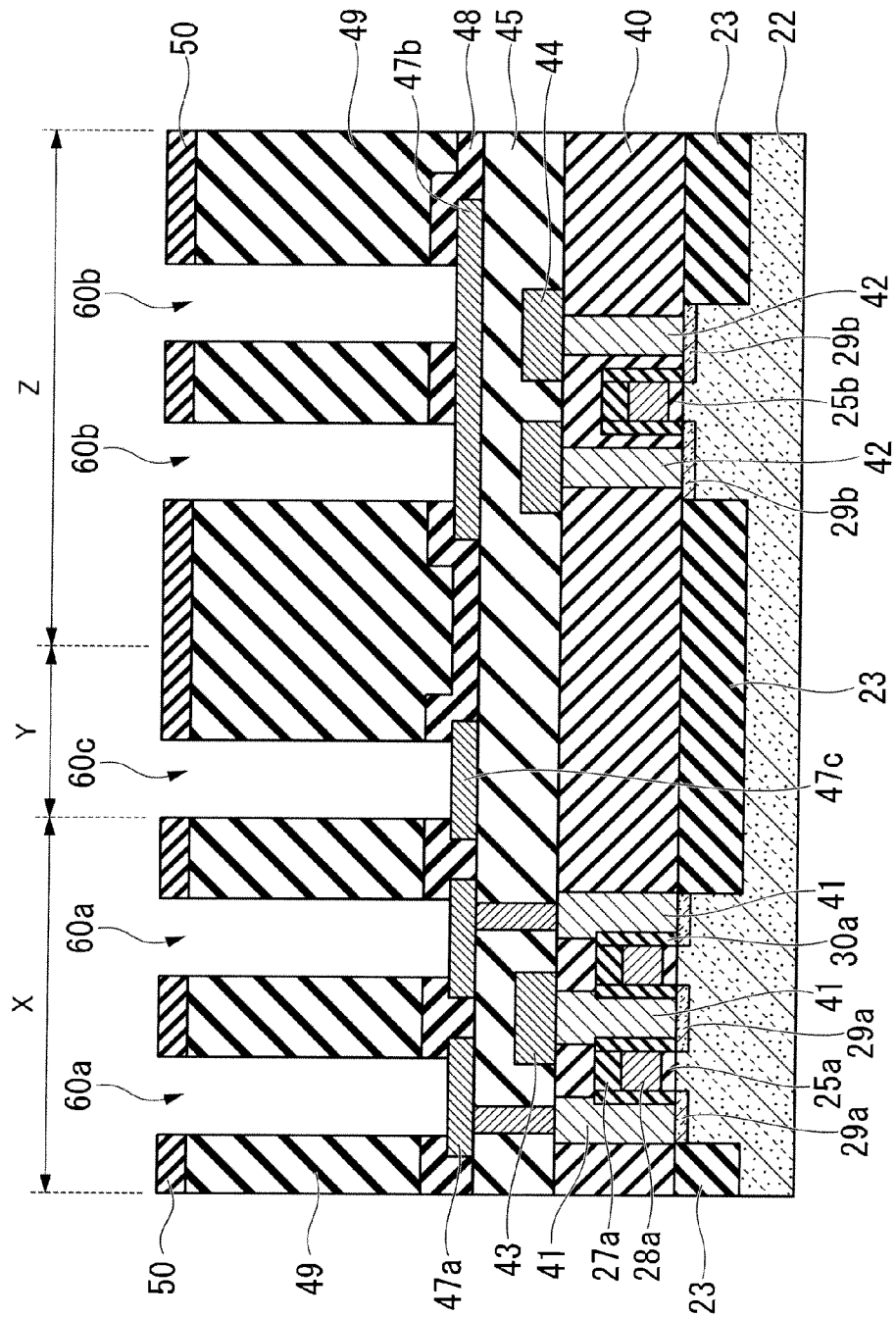

Then, an inter-layer insulting film 49 with a thickness of, for example, 1 μm to 2 μm, is formed over the stopper film 48. Then, a support film 50 with a thickness of, for example, 50 nm to 150 nm is formed over the inter-layer insulating film 49, as shown in FIG. 5.

As a material forming the inter-layer insulating film 49, for example, a silicon oxide film, a BPSG film containing an impurity, and a multi-layered film including these films may be used. As a material forming the support film 50, for example, a silicon nitride film deposited by the LP-CVD method or the ALD method may be used. The support film 50 supports and prevents the lower electrodes 66a from falling in the wet etching process for forming the crown lower electrodes 66 that will be explained later.

Then, an anisotropic dry-etching process is performed to simultaneously form a hole 60a in the memory cell region X, a hole 60b in the peripheral circuit region Z, and a hole 60c in the boundary region Y. The holes 60a, 60h, and 60c penetrate through the support film 50, the inter-layer insulating film 49, and the stopper film 48.

At this time, the holes 60a in the memory cell region X define positions of the lower electrodes 66a of the capacitor 21a to be used in the memory cell 6 as will be explained later. Additionally, the holes 60b in the peripheral circuit region Z define positions of the lower electrodes 66b of a capacitor to be used as the compensation capacitor 10. The hole 60c in the boundary region Y is formed as a groove pattern surrounding the periphery of the memory cell region X. The holes 60a, 60b, and 60c expose the upper surfaces of the pads 47a, 47h, and 47c, respectively.

As shown in FIG. 5, the vertical thickness of the inter-layer insulating film 49 defines the vertical size (height) of the capacitors 21a and 21b, and thus defines the capacitance thereof. The thicker the inter-layer insulating film 49 becomes, the larger the capacitance of the capacitors 21a and 21b become.

However, as the inter-layer insulating film 49 becomes thicker, it becomes more difficult to form the holes 60a, 60b, and 60c. Therefore, it is preferable to determine the thickness of the inter-layer insulating film 49 so that the aspect ratio of the hole (i.e., the ratio of the vertical size to the diameter of the cylinder) becomes 15 to 25.

Additionally, in the peripheral circuit region Z, multiple pieces of the holes 60b are formed with respect to one large pad 47b. In the memory cell region X, on the other hand, one hole 60a is formed with respect to one pad 47a.

Although the case in which the holes 60a and 60b have the same size (diameter) has been explained in the first embodiment, the present invention is not limited thereto. The sizes and planar shapes of the holes 60a and 60b may be different from one another.

For example, the diameter of the hole 60b in the peripheral circuit region Z may be larger than that of the hole 60a in the memory cell region X. In this case, when an inner surface of the concave lower electrode 66h is covered by the dielectric film 67 as will be explained later, an upper portion of the lower electrode 66b can be prevented from being completely covered, thereby enhancing the coverage and preventing an increase in the amount of leak current of the compensation capacitor 10.

In case of the crown capacitor, space, the size of which is obtained by adding the thickness of the upper electrode to the double thickness of the capacitor insulating film covering side surfaces of two adjacent lower electrodes, is required, thereby making it difficult to enlarge the diameter of the lower electrodes.

In case of the concave capacitor, on the other hand, the diameter of the lower electrodes can be enlarged to the degree that adjacent lower electrodes are not shorted. For this reason, even if semiconductor devices are further miniaturized, it is possible to prevent a decrease in the manufacturing yield due to the compensation capacitor.

In the first embodiment, the capacitor 21a in the memory cell 6 is a crown capacitor, and the capacitor 21b used as the compensation capacitor 10 is a concave capacitor. Therefore, the size and the planar shape can be optimized according to the processability of the capacitors 21a and 21h.

Figure 7:
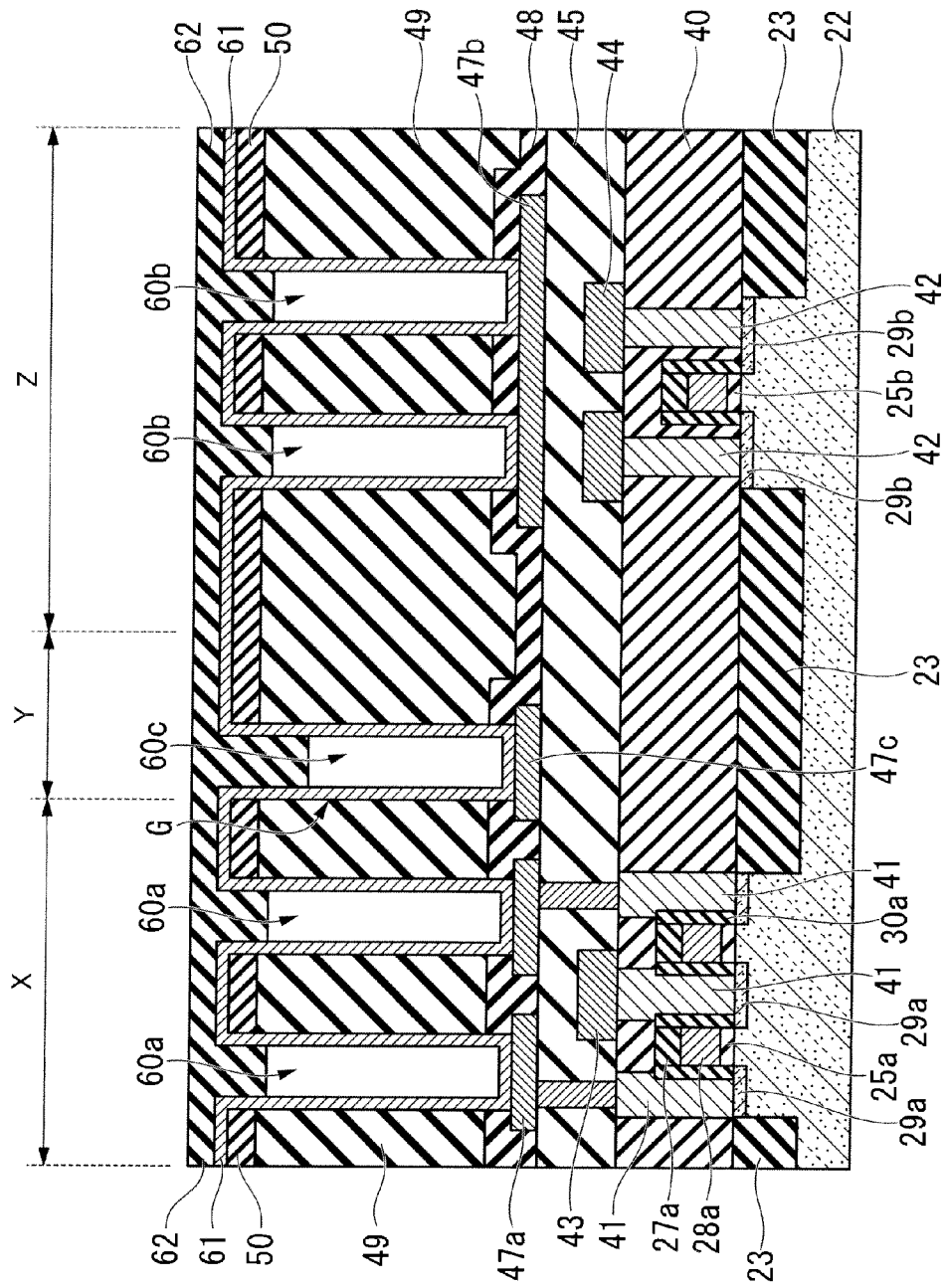

Then, a metal film is formed by the CVD method so as to cover inner surfaces of the holes 60a, 60b, and 60c and an upper surface of the support film 50. Thus, the lower electrode film 61 of the capacitors is formed as shown in FIG. 7. As a material forming the lower electrode film 61, for example, a titanium nitride (TiN) film may be used. The thickness of the lower electrode film 61 is such that the holes 60a, 60b, and 60c are not fully filled with the lower electrode film 61. For example, when the diameter of the hole 60a is 80 nm, the thickness of the lower electrode film 61 is approximately 10 nm to 20 nm.

Then, a cap insulating film 62 is formed over the lower electrode film 61 by a method with poor coverage, such as a plasma CVD method. The cap insulating film 62 is made of, for example, a silicon nitride (SiN) film. At this time, only upper portions of the holes 60a, 60b, and 60c arc filled with the cap insulating film 62.

This is because if a method with poor coverage such as a plasma CVD method is used to form the cap insulating film 62 which is the miniaturized element after the generation of the design rule 65 nm, upper portions of the holes 60a, 60b, and 60c are firstly covered by the cap insulating film 62, and thereafter the cap insulating film 62 does not enter lower portions of the holes 60a, 60b, and 60c.

Since the cap insulating film 62 is removed in a later process, there is no need to completely prevent attachment of the cap insulating film 62 onto the inner surfaces of the holes 60a, 60b, and 60c.

Figure 8:
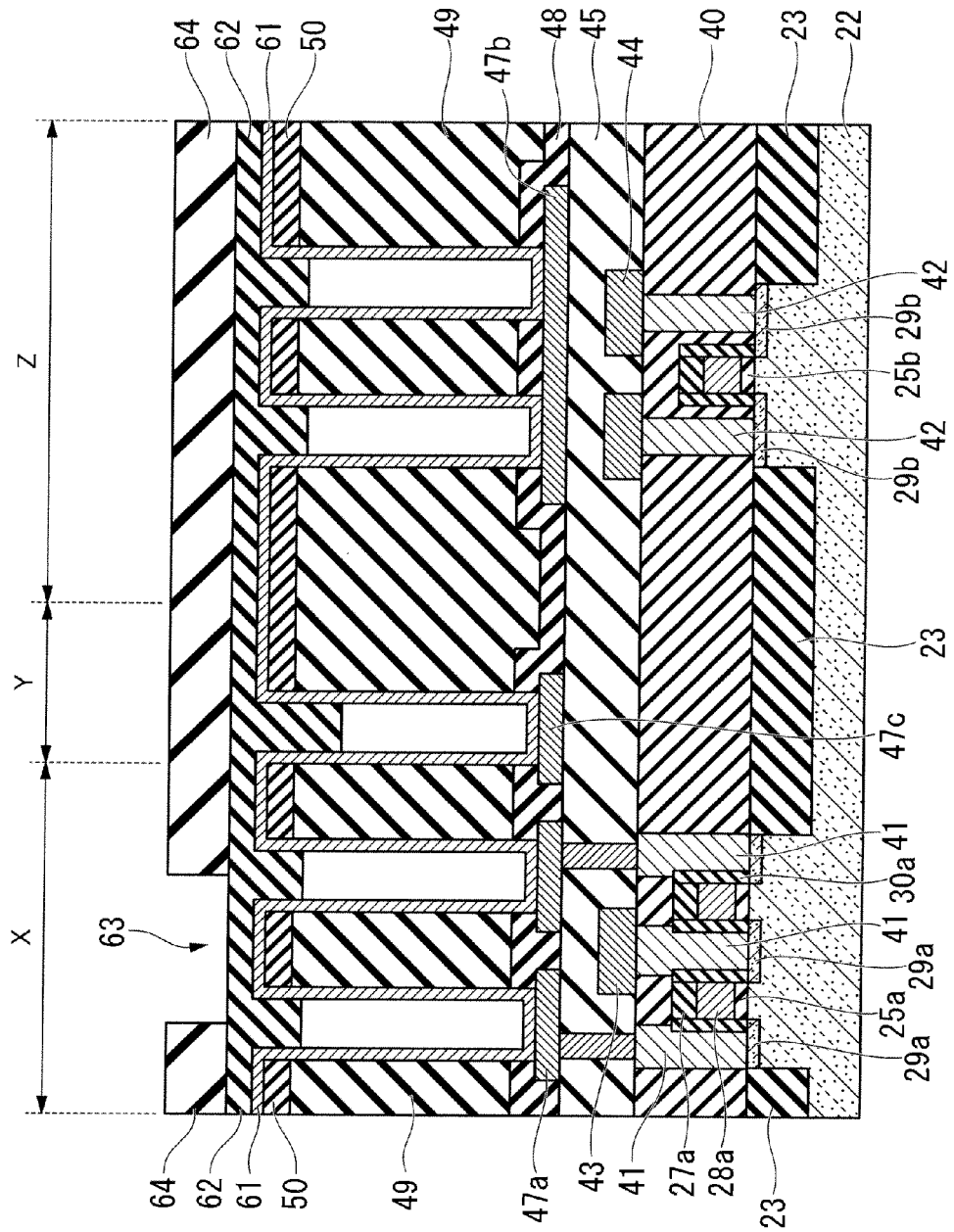

Then, a photoresist film 64 is formed over the cap insulating film 62, as shown in FIG. 8. The photoresist film 64 has an opening 63. The position of the opening 63 corresponds to the position of a window pattern 65 to be formed in the support film 50 in order to cause penetration of an etchant in a later wet-etching process.

Since the cap insulating film 62 is formed before the formation of the photoresist film 64, the photoresist film 64 is prevented from entering the hole 60a. Accordingly, pattern processing of the photoresist film 64 by an exposure process, and removal of the photoresist film 64 after the pattern processing, become easy.

At this time, as shown in FIG. 9, the pattern of the openings 63 is formed in the memory cell region X such that the openings 63 having a rectangular shape are arranged in parallel in plan view. Therefore, the opening 63 is not formed in the boundary region Y and the peripheral circuit region Z. The boundary region Y and the peripheral circuit region Z are completely covered by the photoresist film 64.

The pattern shape of the openings 63 is not limited to the one shown in FIG. 9, and another shape may be used as long as the opening 63 overlaps at least partially and connects adjacent lower electrodes.

Figure 10:
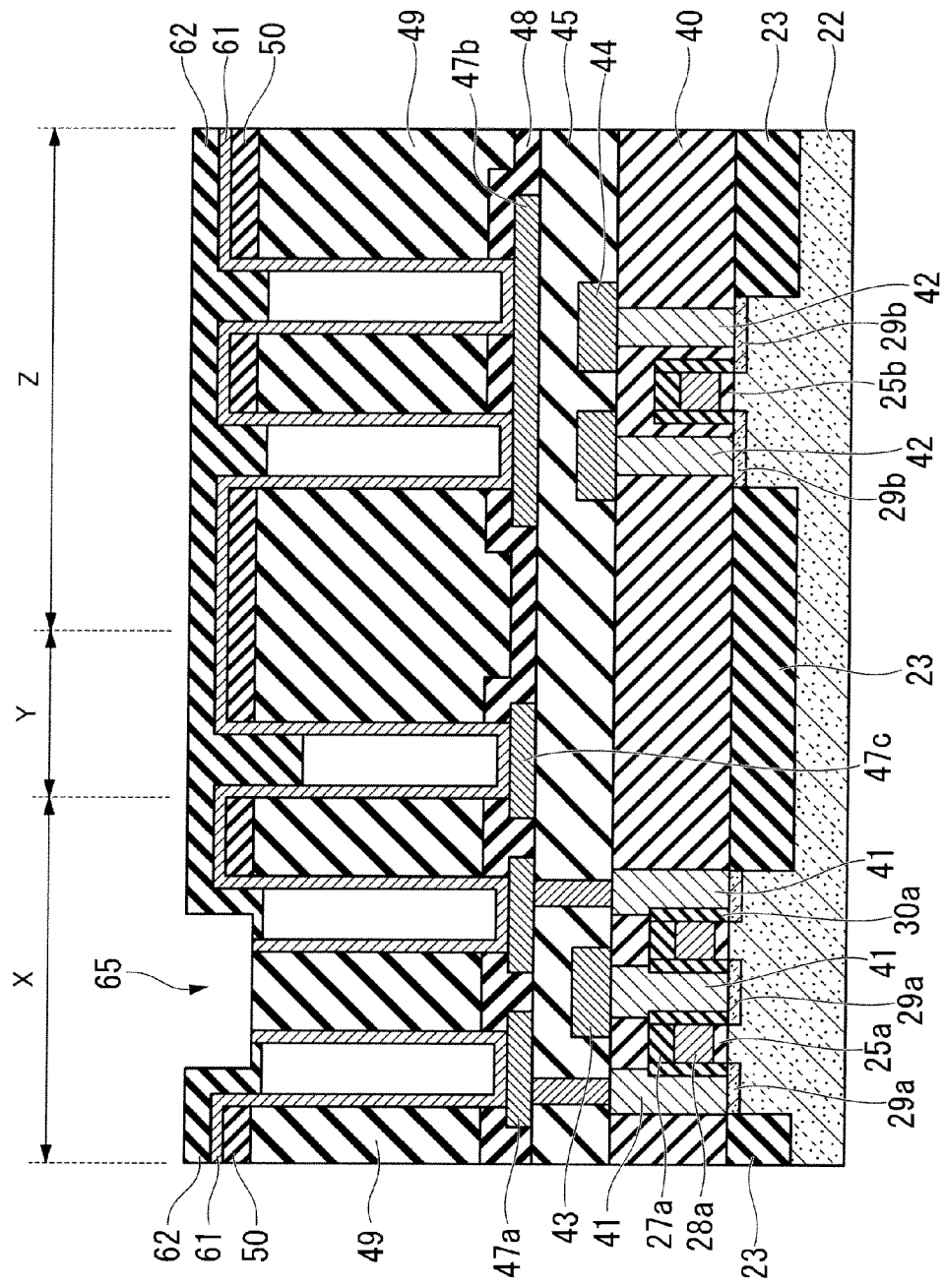

Then, an anisotropic dry-etching process is performed with the photoresist film 64 as a mask to remove part of the cap insulating film 62, the lower electrode film 61, and the support film 50. Thus, the window pattern (opening) 65 is formed in the support film 50 under the opening 63, as shown in FIG. 10. Then, the photoresist film 64 is removed by a plasma ashing method or the like.

Figure 11:
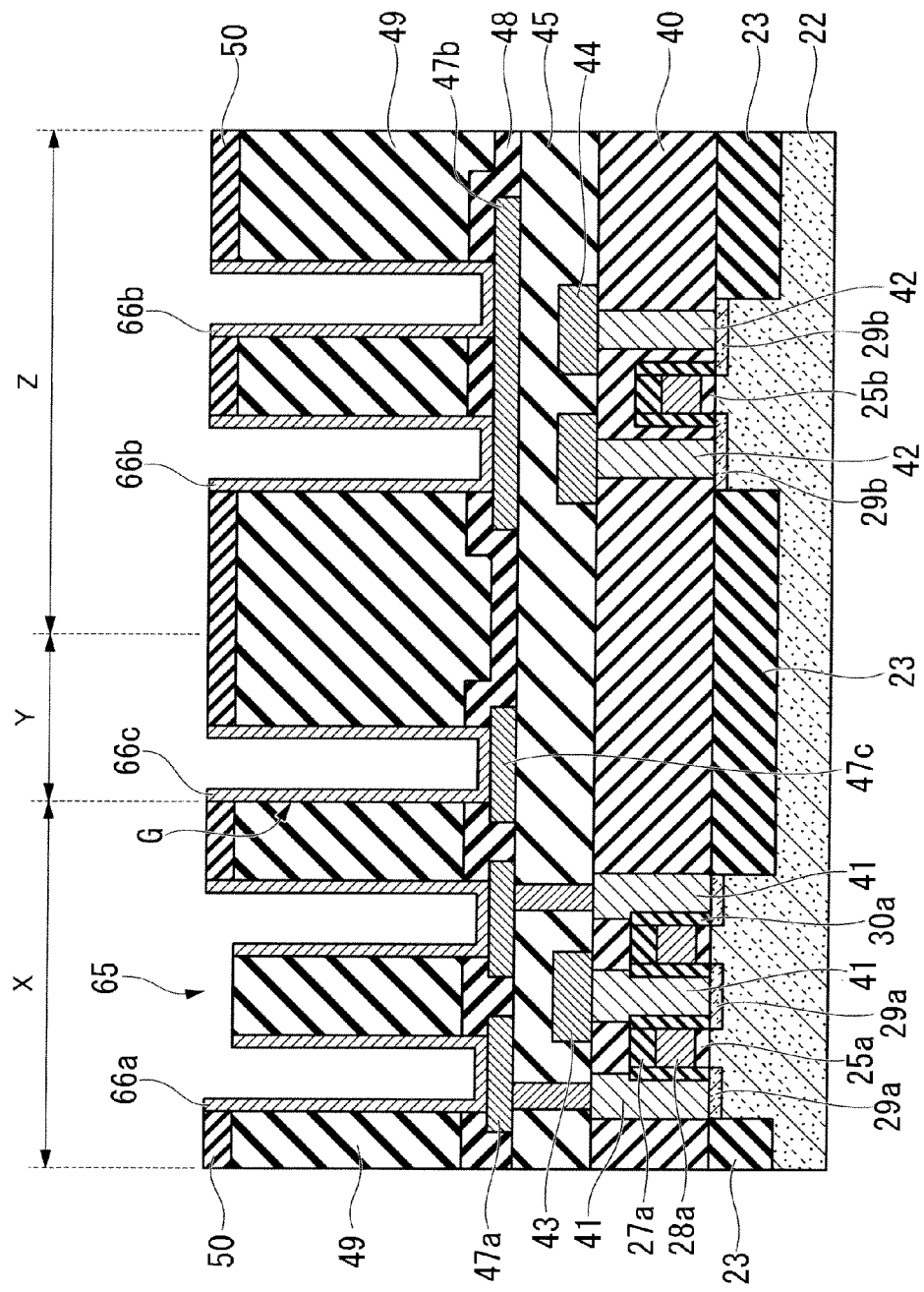

Then, the remaining portions of the cap insulating film 62, and portions of the lower electrode film 61 covering the upper surface of the support film 50 are removed by a dry-etching process, as shown in FIG. 11. At this time, when the aspect ratio of the holes 60a, 60b, and 60c are large (15 or more), the portions of the lower electrode film 61 covering the upper surface of the support film 50 can be removed without causing damage to the portions of the lower electrode film 61 covering the bottom surfaces of the holes 60a, 60b, and 60c.

As explained above, in the first embodiment, the cylindrical lower electrodes 66a and 66b having the bottom surfaces are formed in the memory cell region X and the peripheral circuit region Z, respectively, as shown in FIG. 12. The lower electrodes 66a and 66b cover inner surfaces of the holes 60a and 60b, respectively. The inner surfaces of the lower electrodes 66a and 66b are exposed.

Additionally, the lower electrode 66c, which covers the inner surface of the guard ring G, is formed in the boundary region Y. The lower electrode 66c is used for preventing an etchant from penetrating from the memory cell region X into the peripheral circuit region Z in a wet etching process, and does not function as a capacitor. Further, the remaining portion of the support film 50 in the memory cell region X contacts outer surfaces of the lower electrodes 66a, and functions as a supporter that mechanically supports the lower electrodes 66a.

Then, a wet etching process with diluted hydrofluoric acid (HF) or the like as an etchant is performed to remove the inter-layer insulating film 49 in the memory cell region X. Preferably, a concentration of the diluted hydrofluoric acid solution is 49 wt % (weight percent) in view of a reduction in a time required for the wet etching process. An undiluted hydrofluoric acid solution, which is usually sold for industrial use, may be used as the diluted hydrofluoric acid solution having the above concentration.

Since the silicon nitride film formed by the LP-CVD method or the ALD method is tolerant of hydrofluoric acid in the wet etching process, the stopper film 48 and the support film 50 can prevent the etchant from penetrating from the memory cell region X into the peripheral circuit region Z.

Additionally the lower electrode 66c covering the inner surface of the guard ring G can prevent the etchant from penetrating from the memory cell region X into the peripheral circuit region Z. Thus, only the portion of the inter-layer insulating film 49 in the memory cell region X can be removed.

When the cap insulating film 62 is made of a silicon nitride film formed by the plasma CVD method, the cap insulating film 62 is not tolerant of hydrofluoric acid. Therefore, even if part of the cap insulating film 62 remains on surfaces of the lower electrodes 66a, 66b, and 66c, the remaining part of the cap insulating film 62 is completely removed in the wet etching process.

The outer surfaces of the lower electrodes 66a in the memory cell region X are exposed by the wet etching process, and thus crown electrodes are formed. At this time, the supporter, which is formed by patterning the support film 50, mechanically supports the lower electrodes 66a, and thereby prevents the lower electrodes 66a from collapsing.

Additionally, the support film 50 covers the upper surface of the inter-layer insulating film 49 covering the outer surfaces of the lower electrodes 66b in the peripheral circuit region Z. Accordingly, the wet etching solution does not penetrate into the inter-layer insulating film 49. Therefore, the inter-layer insulating film 49 remains as it is. Consequently, the lower electrodes 66b in the peripheral circuit region Z become concave electrodes, only the inner surfaces of which are exposed.

Figure 14:
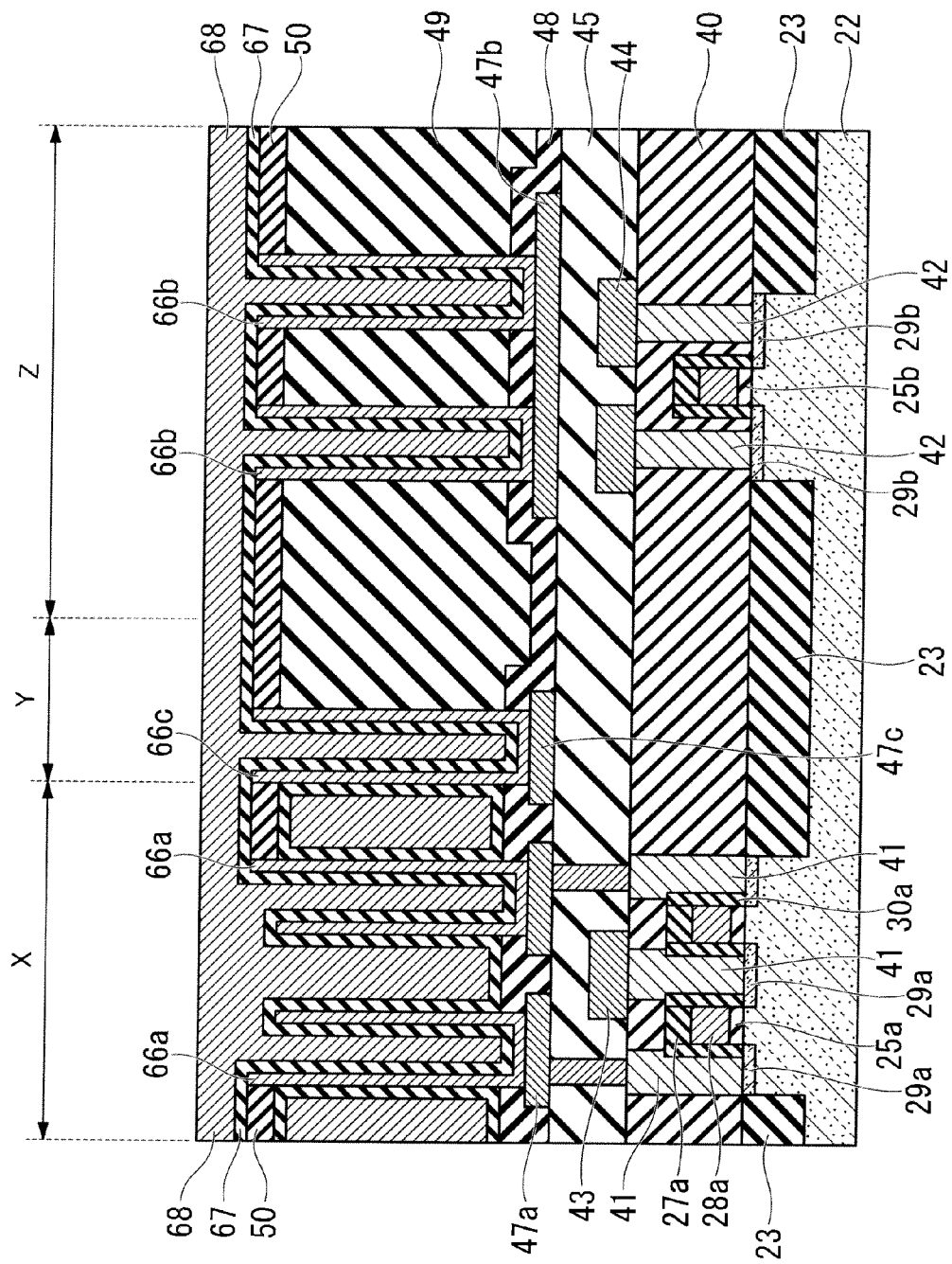

Then, the dielectric film 67 is formed so as to cover the exposed surfaces of the lower electrodes 66a, 66b, and 66c, as shown in FIG. 14. The thickness of the dielectric film 67 is, for example, 6 nm to 10 nm. As a material forming the dielectric film 67, a high dielectric film such as a zirconium oxide ($ZrO_2$) film, a hafnium oxide ($HfO_2$) film, or an aluminum oxide ($Al_2O_3$) film, or a multi-layered structure including these films may be used. For example, the ALD method may be used for forming the dielectric film 67. Thus, the dielectric film 67 covers the inner surface of the lower electrode 66b, and the inner and outer surfaces of the lower electrode 66a.

After the dielectric film 67 is formed, an upper electrode film 68 is formed over the dielectric film 67 so as to fill up the holes 60a, 60b, and 60c, and space between adjacent lower electrodes 66a in the memory cell region X. As a material forming the upper electrode film 68, for example, a titanium nitride (TiN) film may be used.

The upper electrode film 68 may be a multi-layered conductive structure. For example, a titanium nitride film with the thickness of 8 nm to 10 nm is formed. Then, a poly-crystalline silicon film containing an impurity such as boron is formed over the titanium nitride film. Then, a tungsten film is formed over the poly-crystalline silicon film. Thus, the multi-layered film can be formed.

Figure 15:
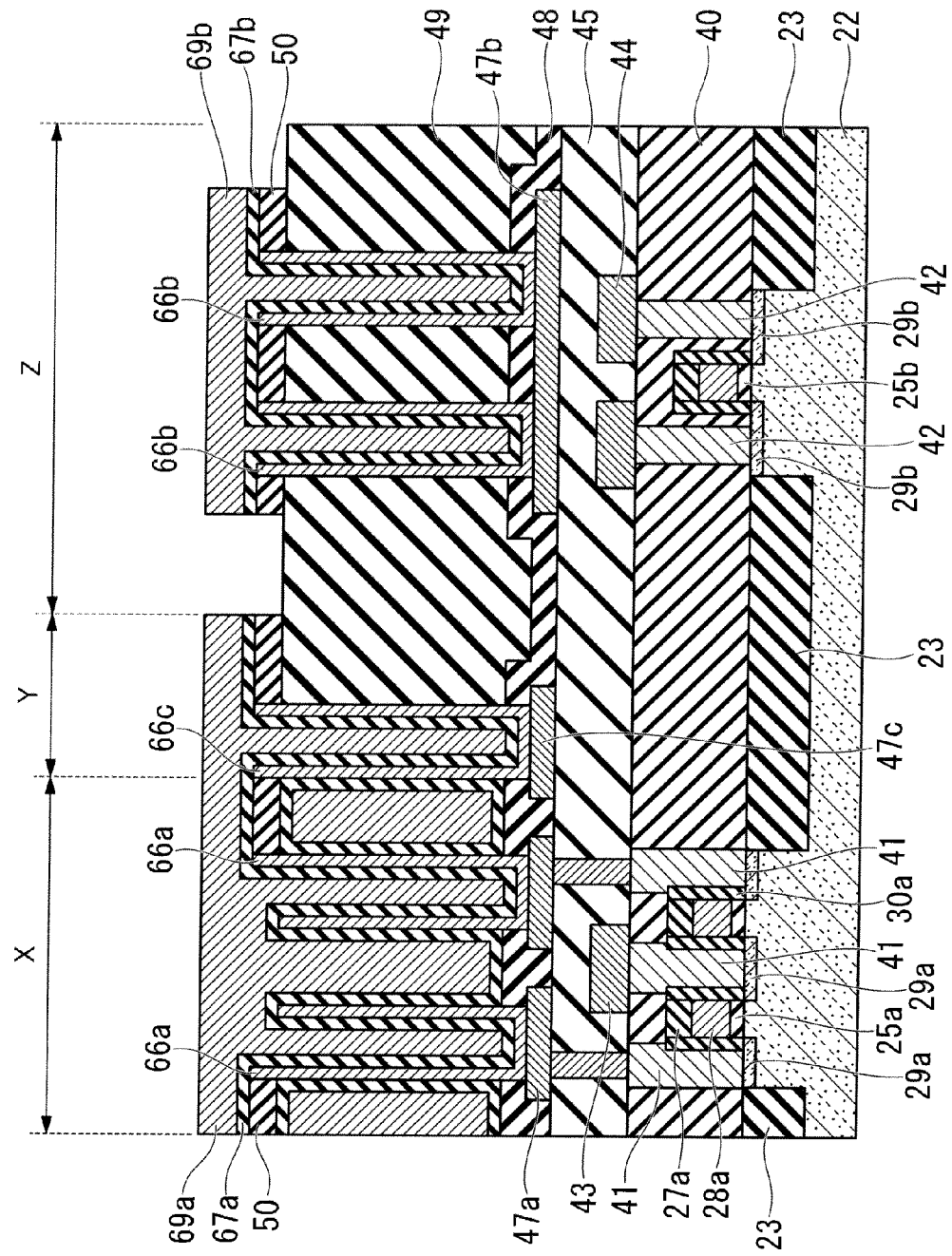

Then, the upper electrode film 68, the dielectric film 67, and the support film 50 are patterned to form a dielectric film 67a and an upper electrode 69a in the memory cell region X, and the dielectric film 67b and an upper electrode 69b in the peripheral circuit region Z, as shown in FIG. 15. Preferably, the underlying support film 50 is also patterned at this time.

Since the support film 50 is unnecessary after the wet etching process, if a portion of the support film 50, which is not covered by the upper electrodes 69a and 69b, is removed, a later process of forming a contact plug penetrating through the inter-layer insulating film 49 will be simplified.

Figure 16:
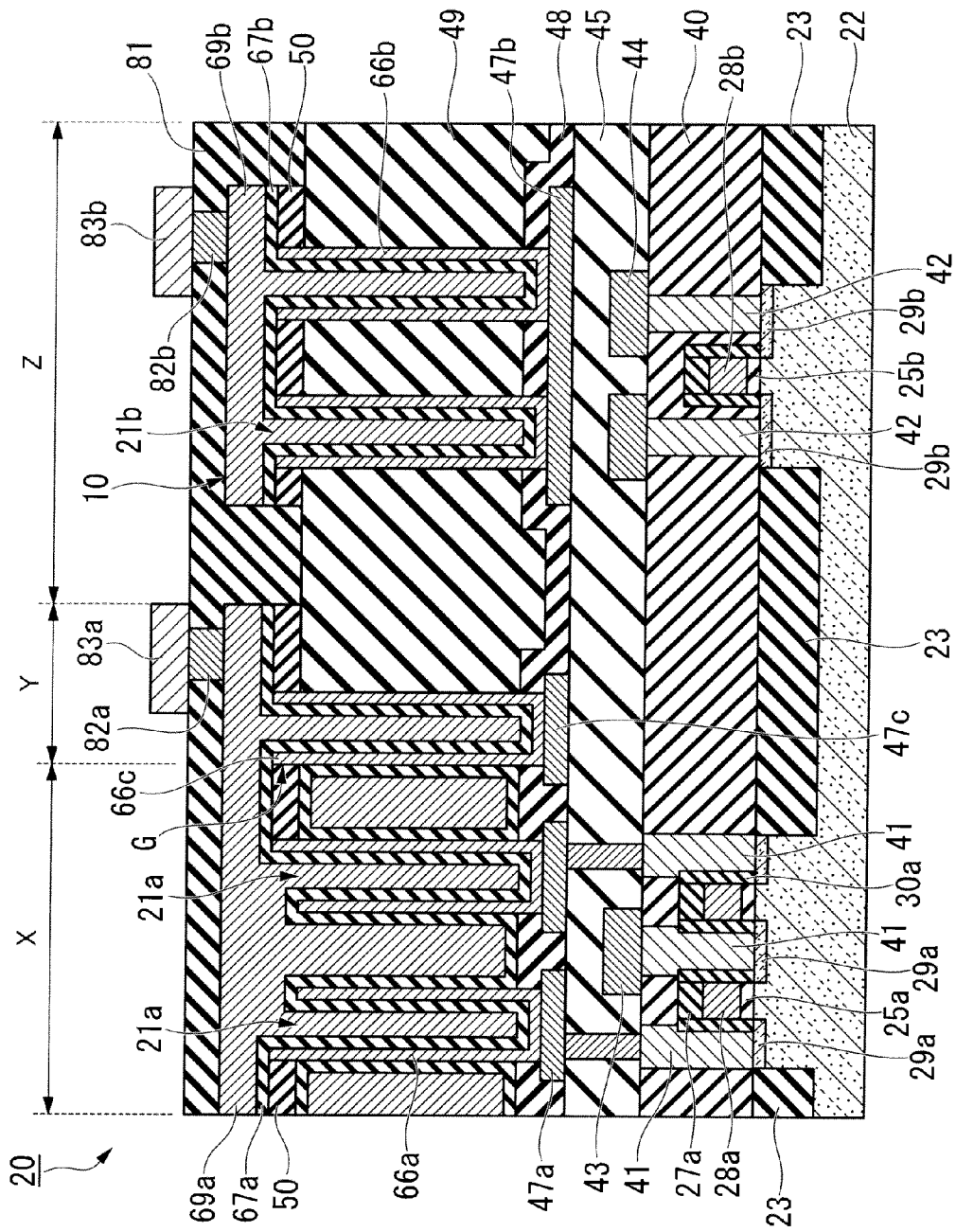
FIGS. 16 and 17 are cross-sectional views illustrating a semiconductor device according to a first embodiment of the present invention.

Then, an inter-layer insulating film 81 is formed so as to cover the upper electrodes 69a and 69b, as shown in FIG. 16. The inter-layer insulating film 81 is made of a silicon oxide film or the like. Then, an upper surface of the inter-layer insulating film 81 is polished and planarized by the CMP method.

Then, contact plugs 82a and 82b are simultaneously formed so as to be connected to the upper electrodes 69a and 69b, respectively. Then, metal wires 83a and 83b are formed so as to be connected to the contact plugs 82a and 82b, respectively. The metal wires 83a and 83b are made of aluminum (Al), copper (Cu), or the like.

Although not shown, a contact plug to be connected to the MOS transistor in the peripheral circuit region Z, and an upper metal wiring layer are simultaneously formed at this time. Then, a protection film (not shown) is formed. Thus, the semiconductor device 20 is complete.

According to the semiconductor device 20 of the first embodiment, the capacitor 21a to be used in the memory cell 6 of the DRAM is a crown capacitor. The capacitor to be used as the compensation capacitor 10 is a concave capacitor.

Additionally, the capacitor 21b used as the compensation capacitor 10 in the peripheral circuit region Z cannot be replaced with new one even if the capacitor 21b has poor characteristics (i.e. the amount of leak current is large). Accordingly, the concave capacitor, which has a smaller possibility of having poor leak current characteristics than a crown capacitor, is used as the compensation capacitor 10, thereby preventing a reduction in the manufacturing yield.

Further, circuit elements forming an MOS transistor can be formed under the compensation capacitor 10 irrespective of the structure of the compensation capacitor 10, thereby achieving a reduction in the occupied area.

Although the concave capacitor has smaller capacitance than that of the crown capacitor, it is not problematic since the required number of concave capacitors can be collectively arranged when the concave capacitors are used as compensation capacitors.

Moreover, there is no need to provide an additional specific process of forming the concave capacitors in manufacturing the semiconductor device 20. Only a change of the photomask pattern is required, thereby lowering manufacturing costs.

Additionally, it is not necessary to form all the compensation capacitors 10 included in one semiconductor chip 1 as concave capacitors, a planar capacitor may be included. For example, the MOS transistor in the peripheral circuit region Z shown in FIG. 16 may be replaced with a planar capacitor. In this case, the gate electrode 28b and the semiconductor substrate 22 may be used as a capacitor electrode. Any one of the planar capacitor and MOS transistor can be formed under the concave capacitor used as the compensation capacitor, so that a reduction in the entire occupied area is maximally achieved.

Second Embodiment

Hereinafter, a semiconductor device according to a second embodiment of the present invention is explained with reference to FIG. 18. The second embodiment is a modification of the first embodiment, and differs from the first embodiment only in the structure of a compensation capacitor. Therefore, like reference numerals denote like elements between the first and second embodiments, and explanations of elements other than the compensation capacitor are omitted appropriately.

Figure 18:
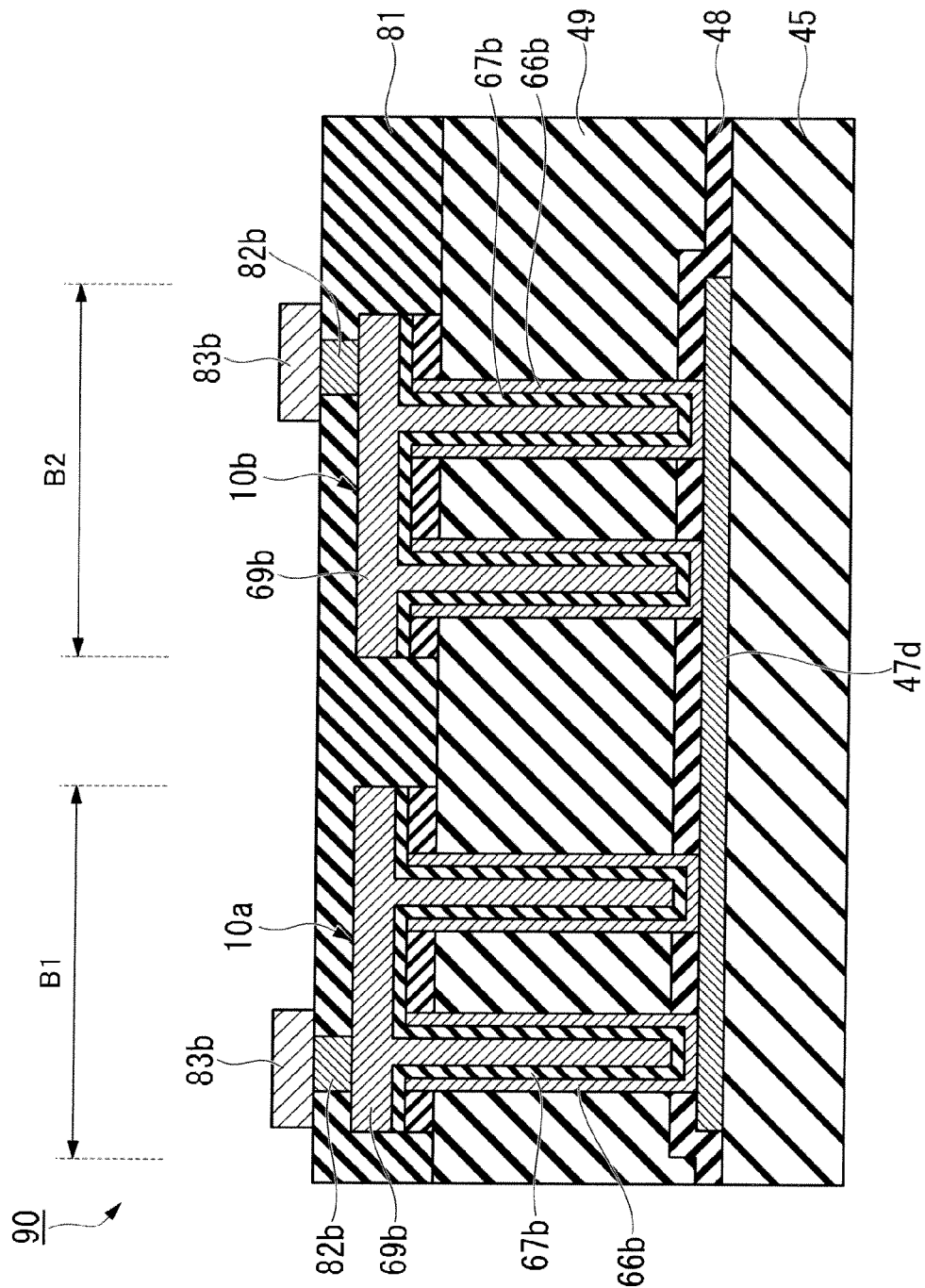
FIG. 18 is a cross-sectional view illustrating a semiconductor device according to a second embodiment of the present invention.

As shown in FIG. 18, a compensation capacitor 90 of the second embodiment has a structure in which multiple blocks are connected in series where the compensation capacitor 10 of the first embodiment is regarded as one block. Specifically, the compensation capacitor element 90 includes a compensation capacitor 10a in a first block B1 and a compensation capacitor 10b in a second block B2.

The upper electrode 69b, which is included in the compensation capacitor 90, is provided for each of the first and second blocks B1 and B2. The drawing wire 83b is provided for each of the first and second blocks. The drawing wire 83b is connected to the upper electrode 69b.

A pad 47d connects the lower electrodes of the concave capacitors in the first and second blocks B1 and B2, and functions as a wire for connecting the first and second blocks B1 and B2 in series. In other words, the lower electrode 66b in the first block is electrically connected to the lower electrode 66b in the second block.

The upper electrode 69b in the first block B1 is connected to the drawing wire 83b through the contact plug 82b. The upper electrode 69b in the second block B2 is connected to the drawing wire 83b through the contact plug 82b.

A ground voltage is applied to one of the drawing wires 83b in the first and second blocks B1 and B2, and the other one of the drawing wires 83b is connected to a power-supply wire. Thus, the compensation capacitor 90 functions as a compensation capacitor having a predetermined capacitance.

According to the semiconductor device of the second embodiment, multiple blocks are connected in series, thereby enabling a reduction in a voltage applied to the capacitor included in each block. Consequently, even when a voltage applied to the dielectric film 67b of the first embodiment is so high as to cause insulation breakdown of the dielectric film 67b, a voltage applied to one block becomes half, thereby reducing a probability of breakdown of the dielectric film 67b. Accordingly, the structure of the second embodiment can be used as a compensation capacitor.

Third Embodiment

Hereinafter, a semiconductor device according to a third embodiment of the present invention is explained with reference to FIG. 19. The third embodiment is a modification of the second embodiment. Like reference numerals denote like elements between the second and third embodiments.

A compensation capacitor 91 of the third embodiment differs from the compensation capacitor 90 of the second embodiment in that the pad 47b is formed for each of a compensation capacitor element 10c in the first block B1 and a compensation capacitor element 10d in the second block B2, and one upper electrode 69d connects lower electrodes in the first and second blocks B1 and B2. In other words, the upper electrode 69d in the first block is electrically connected to the upper electrode 69d in the second block.

In this case, a set of the pad 47b, a drawing wire 84, and a contact plug 85 is provided for each of the first and second blocks B1 and B2. The pad 47b in one block is connected to the drawing wire 84 through the contact plug 85. The upper electrode 69d connects multiple lower electrodes of the concave capacitors in the first and second blocks B1 and B2, and functions as a wire for connecting the first and second blocks B1 and B2 in series.

A ground voltage is applied to one of the drawing wires 84 in the first and second blocks B1 and B2, and the other one of the drawing wires 84 is connected to a wire for supplying an internal power. Thus, the compensation capacitor 91 functions as a compensation capacitor having a predetermined capacitance.

Fourth Embodiment

Hereinafter, a semiconductor device according to a fourth embodiment of the present invention is explained with reference to FIG. 20. The fourth embodiment is a modification of the second embodiment. Like reference numerals denote like elements between the second and third embodiments.

A compensation capacitor 92 of the fourth embodiment differs from the compensation capacitor 90 of the second embodiment in that a bridge wire 94 electrically connects the upper electrode 69b in the first block B1 and the pad 47b in the second block B2 through contact plugs 93 and 95, respectively.

Specifically, the bridge wire 94 is connected, though the contact plug 93, to the upper electrode 69b of a compensation capacitor 10e in the first block B1. Additionally, the bride wire 94 is connected, through the contact plug 95, to the pad 47b of a compensation capacitor 10f in the second block B2. The pad 47b is formed for each of the first and second blocks B1 and B2. The pad 47b in one block connects two lower electrodes of the concave capacitor in the block.

The drawing wire 83b is formed for each of the first and second blocks B1 and B2. The drawing wire 83b in one block is connected to the upper electrode 69b in the block. A ground voltage is applied to one of the drawing wires 83b in the first and second blocks B1 and B2, and the other one of the drawing wires 83b is connected to a wire for supplying an internal power. Thus, the compensation capacitor 92 functions as a compensation capacitor having a predetermined capacitance.

Figure 19:
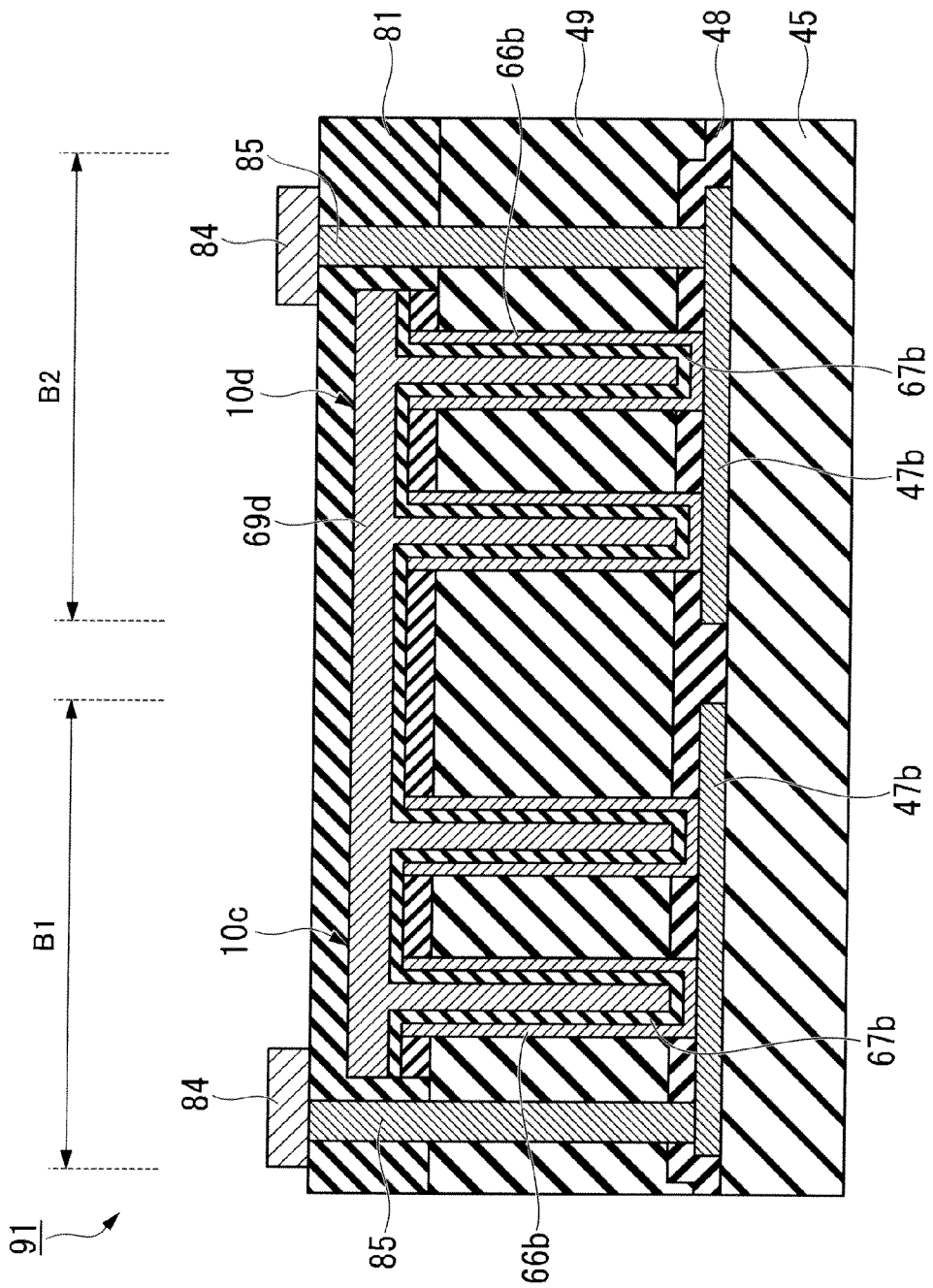
FIG. 19 is a cross-sectional view illustrating a semiconductor device according to a third embodiment of the present invention.
Figure 20:
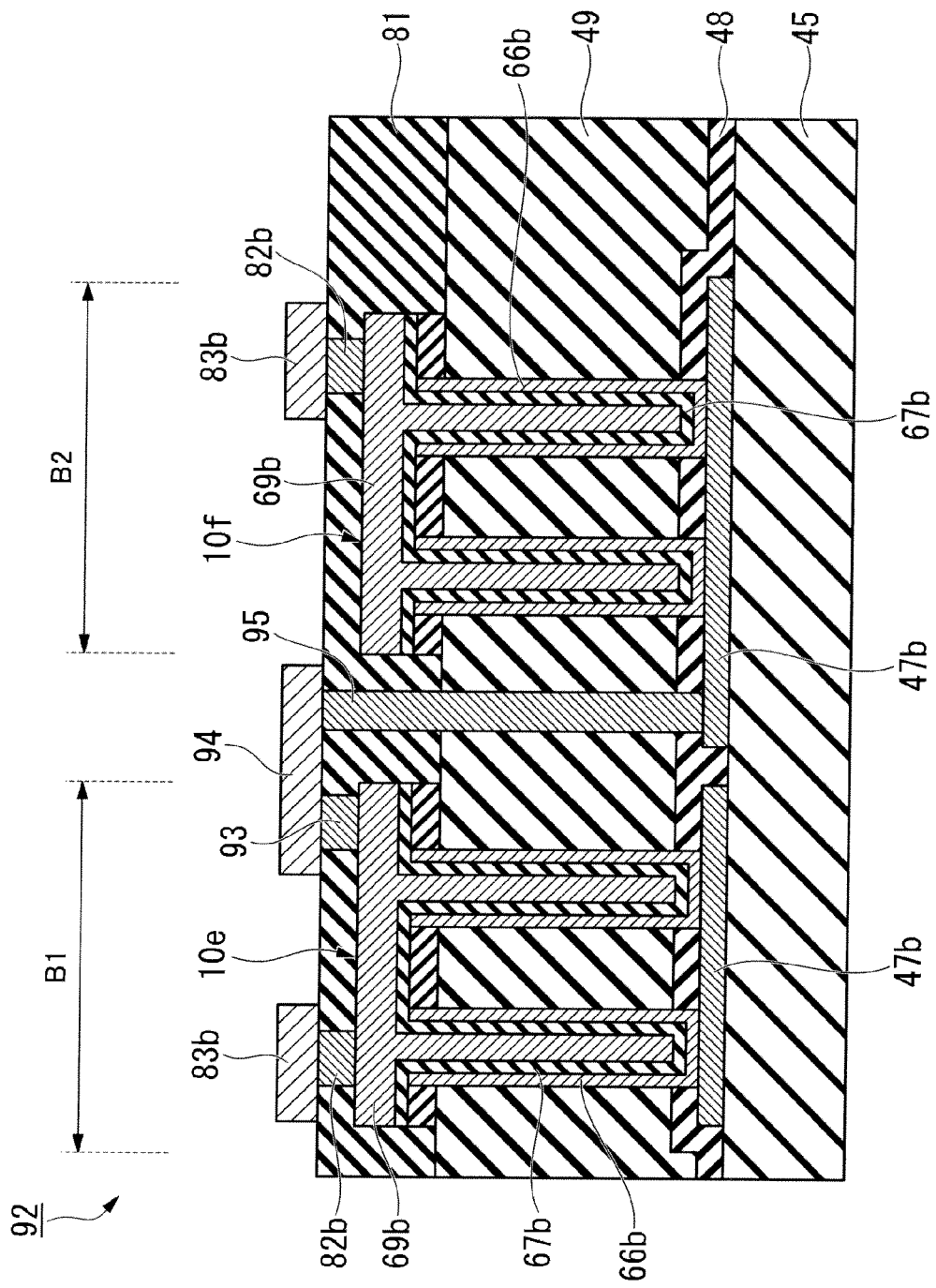
FIG. 20 is a cross-sectional view illustrating a semiconductor device according to a fourth embodiment of the present invention.

When the bridge wire 94 is used as shown in FIG. 20, the controllability of leak characteristics degrades compared to the structures shown in FIGS. 18 and 19. Therefore, when two or more blocks are connected in series, the structures of the second and third embodiments are used preferably.

The number of blocks to be connected in series is not limited to two, and three blocks may be connected in series. When three or more blocks are connected in series, it is preferable to connect the first and second adjacent blocks by the common pad 47 and to connect the second and third adjacent blocks by the common upper electrode 69, and the like. In other words, the common pad 47 and the common upper electrode 69 are alternately used to connect adjacent blocks.

The number of lower electrodes of a concave capacitor in one block and the number of blocks to be connected in series are adjusted accordingly. Thereby, a compensation capacitor having predetermined characteristics can be formed.

COMPARATIVE EXAMPLE

FIG. 21A is a graph illustrating the I-V characteristics when a concave capacitor in one block is used as a compensation capacitor as in the case of the first embodiment. FIG. 21B is a graph illustrating the I-V characteristics when two concave capacitors in two respective blocks are connected in series and used as compensation capacitors as in the case of the second and third embodiments. A horizontal axis denotes an applied voltage. A ground voltage is applied to one of the two drawing wires, and a voltage varying from a negative voltage to a positive voltage is applied to the other one of the two drawing wires. A vertical axis denotes a measured value of leak current.

As shown in FIG. 21A, generally, leak current of a capacitor shows an asymmetric wave when a voltage varying from negative to positive are applied. When two blocks are connected in series as in the case of the second and third embodiments shown in FIGS. 18 and 19, the leak characteristics are averaged since the direction of applying the voltage varying from the negative to positive becomes opposite between the two blocks. For this reason, as shown in FIG. 21B, the leak characteristics in the case of the two blocks connected in series become symmetric when the voltage varying from negative to positive is applied, thereby simplifying control of characteristics.

Figure 22B:
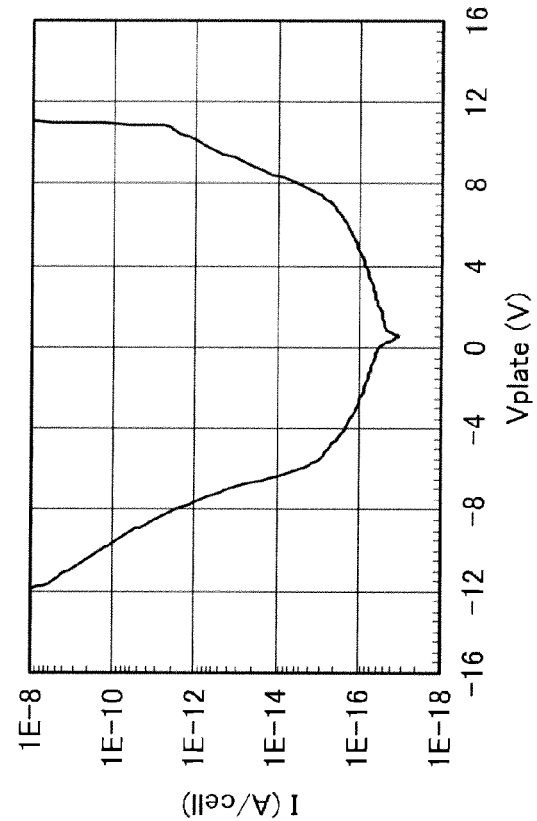
FIG. 22B is a graph illustrating the I-V characteristics of a compensation capacitor of the semiconductor device of the fourth embodiment.
Figure 22A:
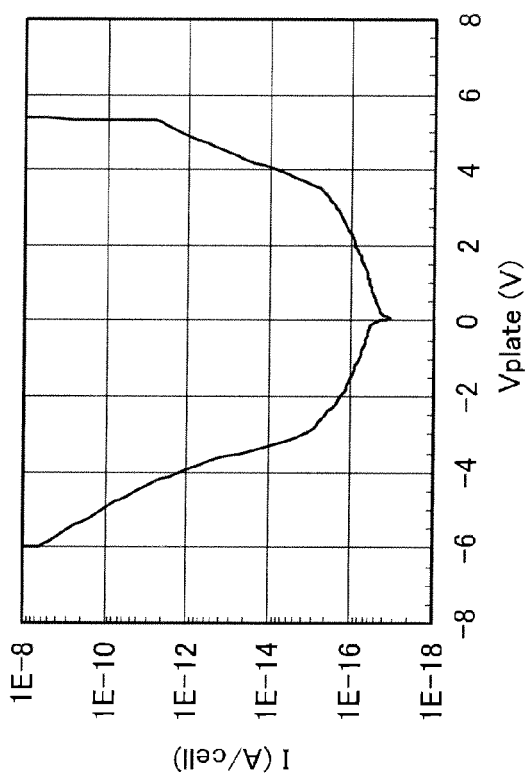
FIG. 22A is a graph illustrating the I-V characteristics of a compensation capacitor of the semiconductor device of the first embodiment.

FIG. 22A is a graph illustrating the I-V characteristics when a concave capacitor in one block is used as a compensation capacitor as in the case of the first embodiment. The I-V characteristics shown in FIG. 22A is the same as that shown in FIG. 21A. FIG. 22B is a graph illustrating the I-V characteristics when two concave capacitors in two respective blocks are connected in series and used as compensation capacitors as in the case of the fourth embodiment shown in FIG. 20.

In the case of the fourth embodiment, the direction of applying the voltage varying from negative to positive is the same between the two blocks. Consequently, the leak characteristics are not averaged, and therefore become asymmetric when the voltage varying from negative to positive is applied, as shown in FIG. 22B.

Accordingly, when two blocks are connected in series, the common pad or the common upper electrode as in the case of the second and third embodiments are preferably used to connect the two blocks. When three or more blocks are connected in series, it is preferable to alternately use the common pad and the common upper electrode to connect adjacent two blocks so that the characteristics are improved.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, and may be modified and changed without departing from the scope and spirit of the invention.

For example, although it has been explained in the first embodiment that the compensation capacitor is connected to the wire for supplying an internal power to the decoder circuit as shown in FIG. 1, the position of the compensation capacitor is not limited thereto. Multiple compensation capacitors may be connected to respective wires for supplying an internal power to another circuit.

The present invention is widely applicable to semiconductor device manufacturing industries. The present invention is applicable not only to a single DRAM chip, but also to a hybrid device in which a DRAM memory cell and a logic circuit element are formed on one semiconductor chip.

In addition, while not specifically claimed in the claim section, the application reserves the right to include in the claim section at any appropriate time the following method of manufacturing a semiconductor device.

In one embodiment, a method of manufacturing a semiconductor device may include, but is not limited to the following processes. A semiconductor substrate having a memory cell region and a peripheral circuit region is prepared. First and second pads are formed over the memory cell region and the peripheral circuit region, respectively. First and second electrodes, which extend vertically from the first and second pads, respectively, are formed. A dielectric film, which covers inner and outer surfaces of the first electrode and an inner surface of the second electrode, is formed. A third electrode covering the dielectric film is formed.

Regarding the method, forming the first and second electrodes includes, but is not limited to the following processes. A first insulating film, which covers the first and second pads and the semiconductor substrate, is formed. First and second holes penetrating the first insulating film are formed so as to expose the first and second pads, respectively. An electrode film, which covers inner surfaces of the first and second holes, is formed to form the first and second electrodes.

The method may further include, but is not limited to the following process. Before the dielectric film is formed, a first portion of the first insulating film is removed, the first portion covering an outer surface of the first electrode.

The method may further include, but is not limited to the following process. Before the first portion is removed, a support film is formed over the first insulating film. The first and second holes penetrating through the support film are formed while the support film mechanically supporting the first and second electrodes.

Regarding the method, the first portion is removed while a second portion of the first insulating film remains, the second portion covering an outer surface of the second electrode.

Regarding the method, the semiconductor substrate further has a boundary region other than the memory cell region and the peripheral circuit region. The method may further include, but is not limited to the following processes. A third pad is formed over the boundary region. The third pad surrounds the memory cell region. A fourth electrode extending vertically from the third pad is formed. The fourth electrode surrounds the memory cell region.

The method may further include, but is not limited to the following processes. Before the first and second pads are formed, a second insulating film is formed over the semiconductor substrate. A gate electrode is formed over the second insulating film. A third insulating film, which covers the gate electrode and the second insulating film, is formed. The first and second pads are formed over the third insulating film.

What is claimed is:

1. A semiconductor device comprising:
    a semiconductor substrate having at least first and second regions;
    a memory capacitor over the first region, the memory capacitor comprising:
        a first lower electrode, the first lower electrode being a cup-shaped electrode;
        a first dielectric film covering the first lower electrode;
        a first upper electrode covering the first dielectric film; and
    a first compensation capacitor over the second region, the first compensation capacitor comprising:
        a second lower electrode, the second lower electrode being a cup-shaped electrode;
        a second dielectric film covering the second lower electrode; and
        a second upper electrode covering the second dielectric film,
    wherein an inside of the cup-shaped electrode of the first compensation capacitor is filled with the second upper electrode,
    wherein the second upper electrode is connected to a first wire via a first plug,
    wherein a connected portion of the second upper electrode and the first plug is disposed higher than a highest portion of the second lower electrode, and
    wherein a diameter of the first lower electrode is smaller than that of the second lower electrode.

2. The semiconductor device according to claim 1, wherein
    the first dielectric film covers inner and outer surfaces of the first lower electrode;
    the second dielectric film covers an inner surface of the second lower electrode.

3. The semiconductor device according to claim 1, further comprising:
    a second compensation capacitor over the second region, the second compensation capacitor comprising:
        a third lower electrode;
        a third dielectric film covering the third lower electrode; and
        a third upper electrode covering the third dielectric film,
    wherein the second lower electrode is electrically connected to the third lower electrode by a first pad, and
    wherein the second upper electrode and the third upper electrode are disposed separately from each other.

4. The semiconductor device according to claim 3,
    wherein the second upper electrode is connected to a first wire that is supplied with a first voltage, and
    wherein the third upper electrode is connected to a second wire that is supplied with a second voltage different from the first voltage.

5. The semiconductor device according to claim 3,
    wherein the first compensation capacitor further comprises:
        a fourth lower electrode; and
        a fourth dielectric film covering the fourth lower electrode,
    wherein the second compensation capacitor further comprises:
        a fifth lower electrode; and
        a fifth dielectric film covering the fourth lower electrode,
    wherein the second upper electrode covers the fourth dielectric film and the third upper electrode covers the fifth dielectric film, and
    wherein the second, third, fourth and fifth lower electrodes are electrically connected to the first pad.

6. The semiconductor device according to claim 5, wherein the second, third, fourth and fifth lower electrodes extend vertically from the first pad.

7. The semiconductor device according to claim 5, further comprising:
    a first insulating film covering an each outer surface of the second, third, fourth and fifth lower electrodes.

8. The semiconductor device according to claim 3, wherein the first upper electrode covers inner and outer surfaces of the first lower electrode.

9. The semiconductor device according to claim 3,
    wherein the second upper electrode is connected to a first wire via a first plug, and
    wherein the third upper electrode is connected to a second wire via a second plug.

10. The semiconductor device according to claim 3, wherein the semiconductor substrate has a third region other than the first and second regions, and
    wherein the semiconductor device further comprises:
        a sixth lower electrode over the third region, the first dielectric film covering an inner surface of the sixth lower electrode, and the sixth lower electrode surrounding the first region in plan view.

11. The semiconductor device according to claim 3, further comprising:
   a gate electrode structure over the first region;
   a second insulating film covering at least the gate electrode structure and the semiconductor substrate; and
   a first impurity layer in the first region, the first impurity layer being positioned adjacent to an upper surface of the semiconductor substrate and the gate electrode structure,
   wherein the memory capacitor is positioned over the second insulating film, and
   the first lower electrode is electrically connected to the first impurity layer.

12. A semiconductor device comprising:
   a memory capacitor disposed over a first region, the memory capacitor including a first lower electrode, a first dielectric film covering the first lower electrode, and a first upper electrode covering the first dielectric film; and
   first and second compensation capacitors disposed over a second region, the first compensation capacitor including a second lower electrode, a second dielectric film covering the second lower electrode, and a second upper electrode covering the second dielectric film, the second compensation capacitor including a third lower electrode, and a third dielectric film covering the third lower electrode,
   wherein the second upper electrode covers the third dielectric film,
   wherein the second lower electrode is connected to a first pad,
   wherein the third lower electrode is connected to a second pad,
   wherein the first and the second pad are disposed separately from each other,
   wherein an inside of the second lower electrode of the first compensation capacitor is filled with the second upper electrode,
   wherein the second upper electrode is connected to a first wire via a first plug, and
   wherein a connected portion of the second upper electrode and the first plug is disposed higher than a highest portion of the second lower electrode.

13. The semiconductor device according to claim 12, wherein the first pad is connected to a first wire that is supplied with a first voltage, and
   the second pad is connected to a second wire that is supplied with a second voltage different from the first voltage.

14. The semiconductor device according to claim 13, wherein the first pad is connected to the first wire via a first plug, and
   wherein the second pad is connected to the second wire via a second plug.

15. The semiconductor device according to claim 13, wherein the first compensation capacitor further comprises:
   a fourth lower electrode;
   a fourth dielectric film covering the fourth lower electrode; and
   a second upper electrode covering the fourth dielectric film,
   wherein the second compensation capacitor further comprises:
   a fifth lower electrode;
   a fifth dielectric film covering the fifth lower electrode; and
   a second upper electrode covering the fourth dielectric film;
   wherein the second and fourth lower electrodes are connected to the first pad, and
   wherein the third and fifth lower electrodes are connected to the second pad.

16. The semiconductor device according to claim 15,
   wherein each of the first, second, and third lower electrodes has a cylindrical shape, and
   wherein each diameter of the second and third lower electrodes is larger than a diameter of the first lower electrode.

17. A semiconductor device comprising:
   a first wire supplied with a first power source;
   a second wire supplied with a second power source different from the first power source;
   a first compensation capacitor comprising:
      a plurality of first electrodes disposed separately from one another,
      a first dielectric film covering the plurality of first electrodes, and
      a second electrode covering the first dielectric film so that the second electrode faces the plurality of first electrodes via the first dielectric film;
   a second compensation capacitor comprising:
      a plurality of third electrodes disposed separately from one another,
      a second dielectric film covering the plurality of third electrodes, and
      a fourth electrode covering the second dielectric film so that the fourth electrode faces the plurality of third electrodes via the second dielectric film;
   a first conductive pad electrically connected to the plurality of first electrodes; and
   a second conductive pad electrically connected to the plurality of third electrodes,
   wherein the first and second compensation capacitors are electrically connected in series between the first and second wires,
   wherein the second electrode is electrically connected to the fourth electrode,
   wherein the first conductive pad is electrically connected to the first wire, and
   wherein the second conductive pad is electrically connected to the second wire.

18. The semiconductor device according to claim 17,
   wherein each of the plurality of first electrodes is a cup-shaped electrode and,
   wherein each of the plurality of second electrodes is the cup-shaped electrode.

19. The semiconductor device according to claim 18, the semiconductor device further comprising:
   a memory cell including a capacitor, the capacitor including a second cup-shaped electrode having a diameter smaller than that of one of the first and third electrodes.

* * * * *